(12) United States Patent
Ono et al.

(10) Patent No.: US 6,803,639 B2
(45) Date of Patent: Oct. 12, 2004

(54) PHOTO-SEMICONDUCTOR MODULE AND METHOD FOR MANUFACTURING THE SAME

(75) Inventors: Masahiro Ono, Osaka (JP); Minehiro Itagaki, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 39 days.

(21) Appl. No.: 10/046,265

(22) Filed: Jan. 16, 2002

(65) Prior Publication Data

US 2002/0098609 A1 Jul. 25, 2002

(30) Foreign Application Priority Data

Jan. 19, 2001 (JP) .................................... P2001-011165

(51) Int. Cl.[7] .................... H01L 31/0203; H01L 27/14; H01L 23/52
(52) U.S. Cl. .................... 257/433; 257/431; 257/778
(58) Field of Search .................... 257/414, 431, 257/432, 433, 458, 461, 678, 680, 684, 778, 784, 787; 174/52.1, 52.2

(56) References Cited

U.S. PATENT DOCUMENTS

| | | | | |
|---|---|---|---|---|
| 3,590,344 A | * | 6/1971 | Roberts et al. ............. 317/235 |
| 4,136,357 A | * | 1/1979 | Frederiksen ................. 357/72 |
| 4,307,934 A | * | 12/1981 | Palmer ....................... 350/96.2 |
| 4,355,321 A | * | 10/1982 | Yeats .......................... 357/30 |
| 4,368,481 A | * | 1/1983 | Ohashi et al. ................ 357/30 |
| 5,625,733 A | * | 4/1997 | Frigo et al. ................... 385/88 |
| 5,641,996 A | * | 6/1997 | Omoya et al. .............. 257/787 |
| 5,764,832 A | * | 6/1998 | Tabuchi ....................... 385/88 |
| 5,977,567 A | * | 11/1999 | Verdiell ....................... 257/99 |
| 6,207,950 B1 | * | 3/2001 | Verdiell ....................... 250/239 |
| 6,320,257 B1 | * | 11/2001 | Jayaraj et al. ............... 257/723 |
| 6,380,563 B2 | * | 4/2002 | Farnworth et al. ............ 257/99 |
| 6,403,948 B1 | * | 6/2002 | Tachigori ............... 250/227.11 |
| 6,435,733 B1 | * | 8/2002 | Parat et al. .................... 385/88 |
| 6,465,858 B2 | * | 10/2002 | Iida et al. ................... 257/433 |
| 6,485,197 B1 | * | 11/2002 | Kato ........................... 385/92 |
| 6,623,178 B1 | * | 9/2003 | Sakurai et al. ................ 385/92 |

FOREIGN PATENT DOCUMENTS

| JP | 7-86693 | 3/1995 |
|---|---|---|
| JP | 8-111559 | 4/1996 |

OTHER PUBLICATIONS

Oikawa et al. "Packaging Technology for a 10–Gb/s Photoreceiver Module", Journal of Lightwave Technology, vol. 12, No. 2, Feb. 1994, pp. 343–352.*

* cited by examiner

Primary Examiner—David A. Zaneke
Assistant Examiner—Scott B. Geyer
(74) Attorney, Agent, or Firm—McDermott Will & Emery LLP

(57) ABSTRACT

In a photo-semiconductor module of the present invention, a light-receiving photo-semiconductor device is mounted flip-chip-wise on a circuit board to then fix an optical fiber to a mounting face of the light-receiving photo-semiconductor or a back face of this mounting face, thus improving a high-frequency characteristic.

15 Claims, 18 Drawing Sheets

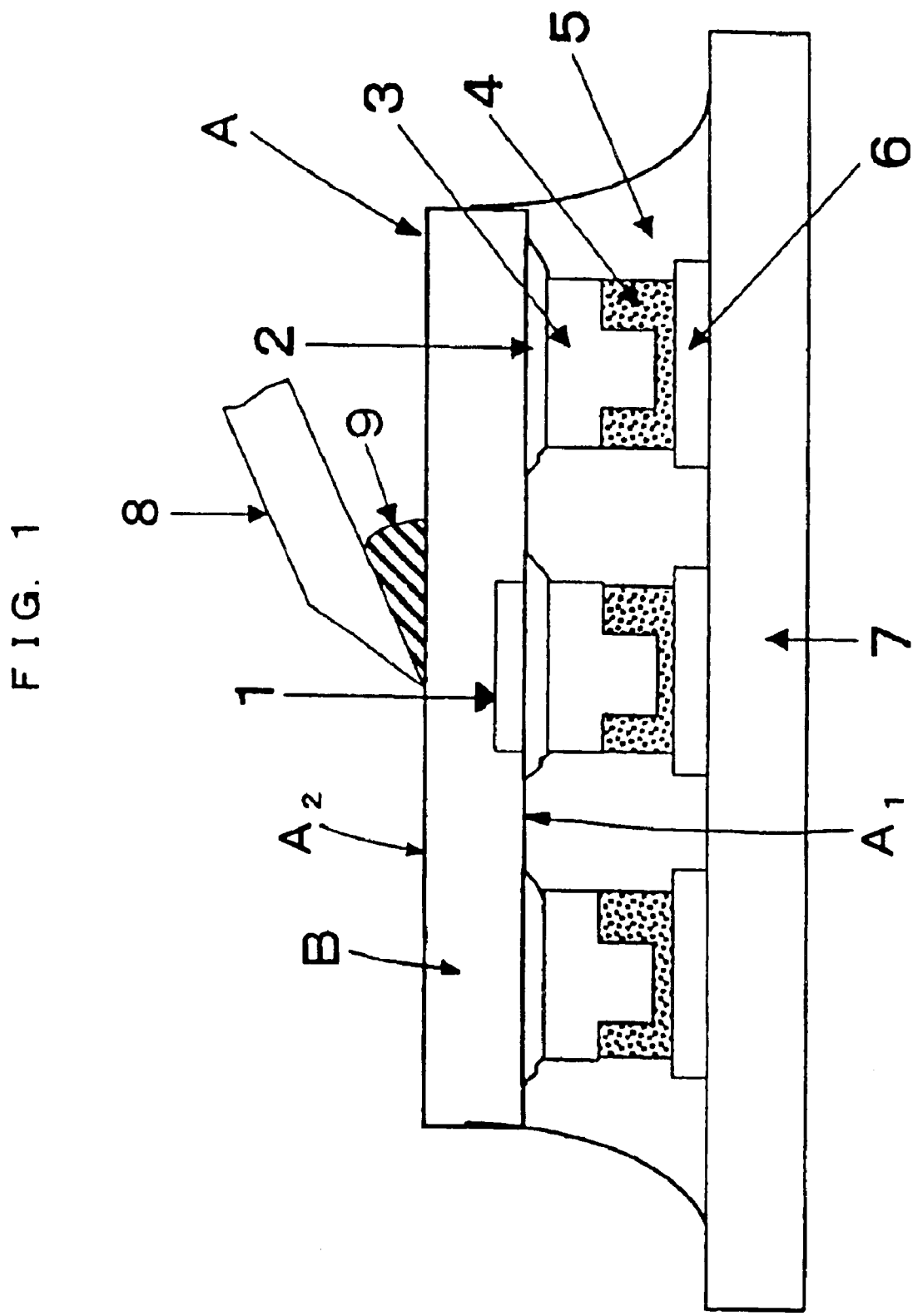

FIG. 2A  Solder heat test (270 °C, 5 cycles)
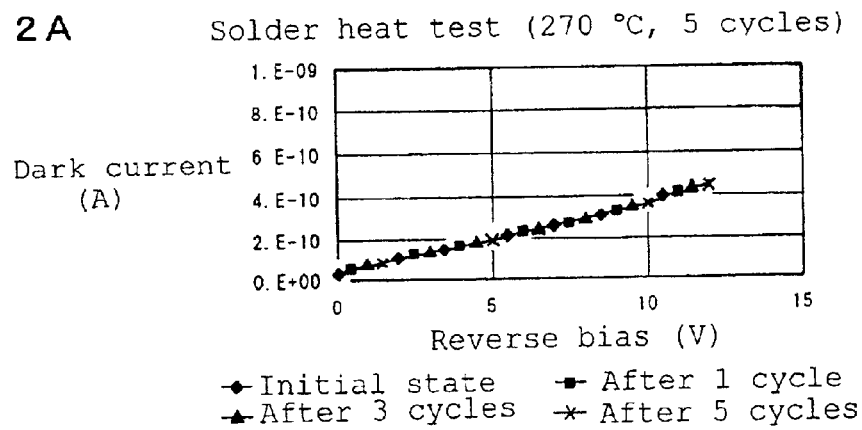
FIG. 2B High temperature and high humidity test (85 °C, 85 %RH)
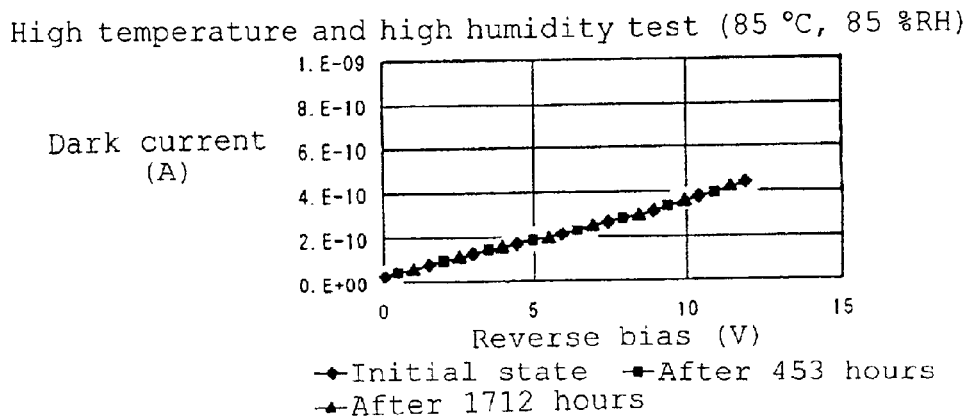
FIG. 2C-1  Temperature cycle test (-40 to 125 °C)
Sample 1
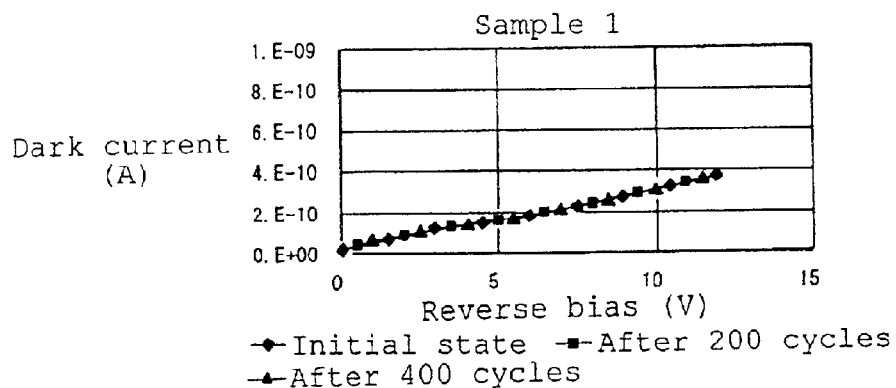
FIG. 2C-2  Temperature cycle test (-40 to 125 °C)
Sample 2
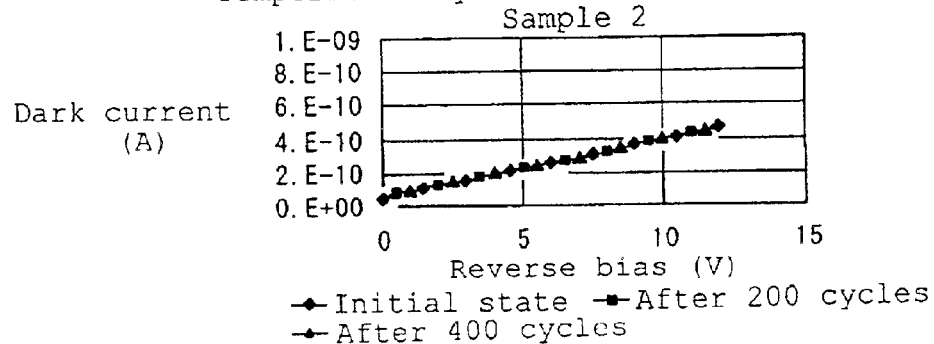

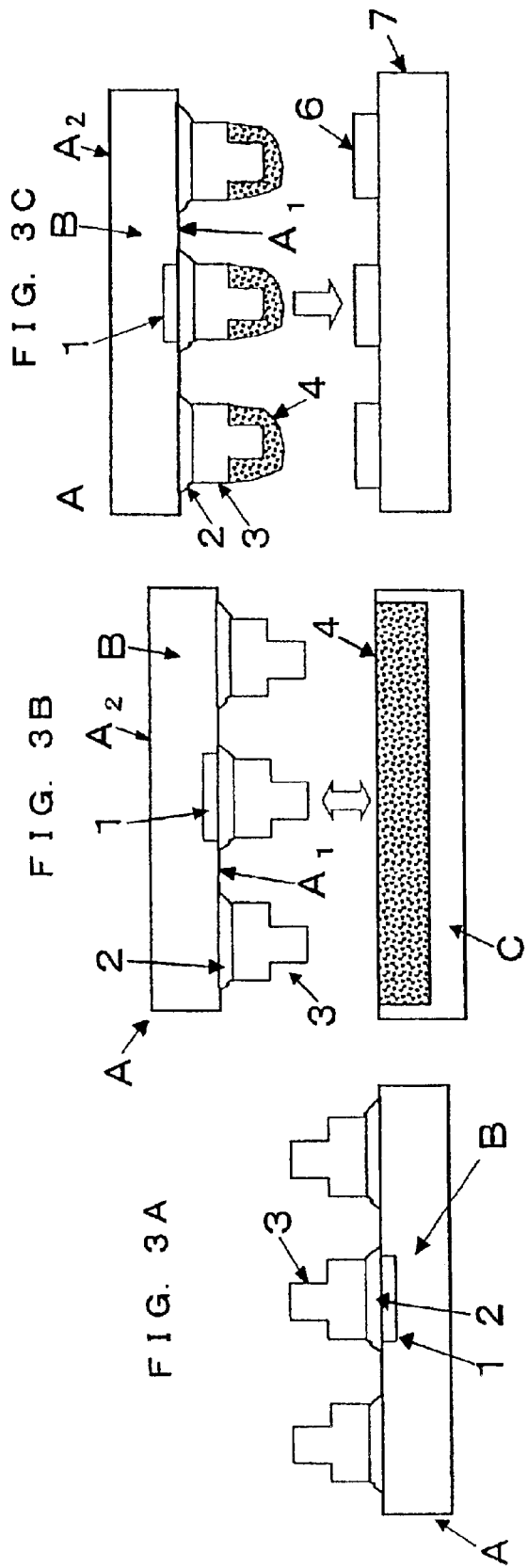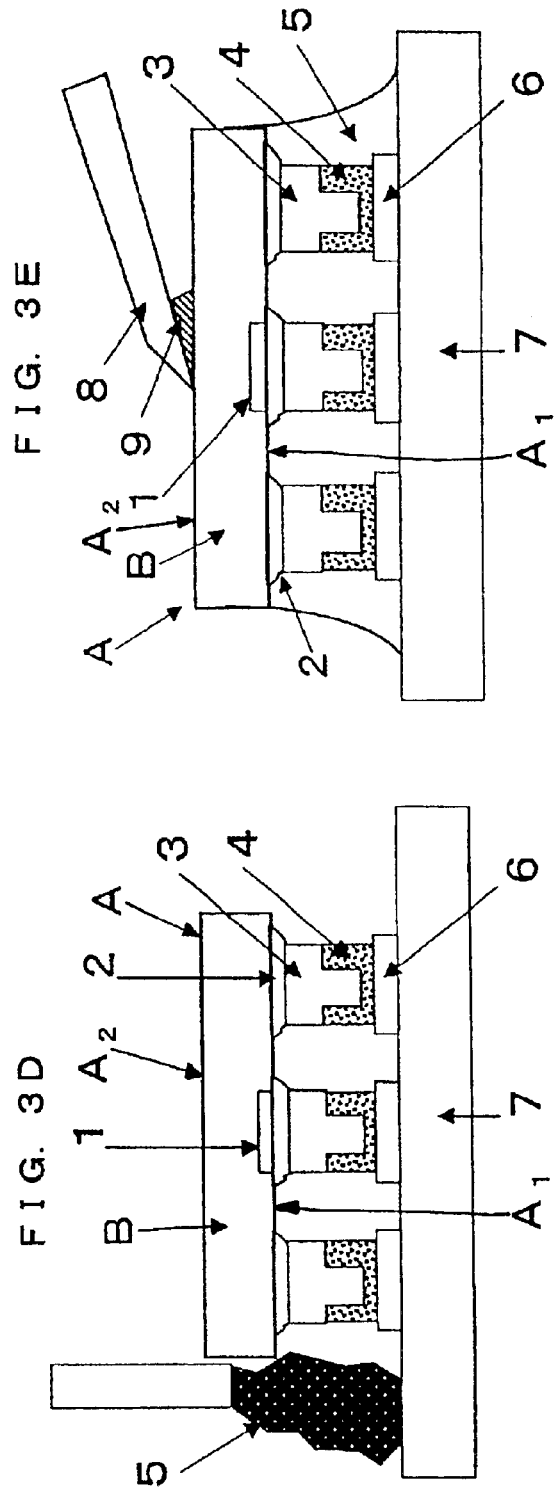

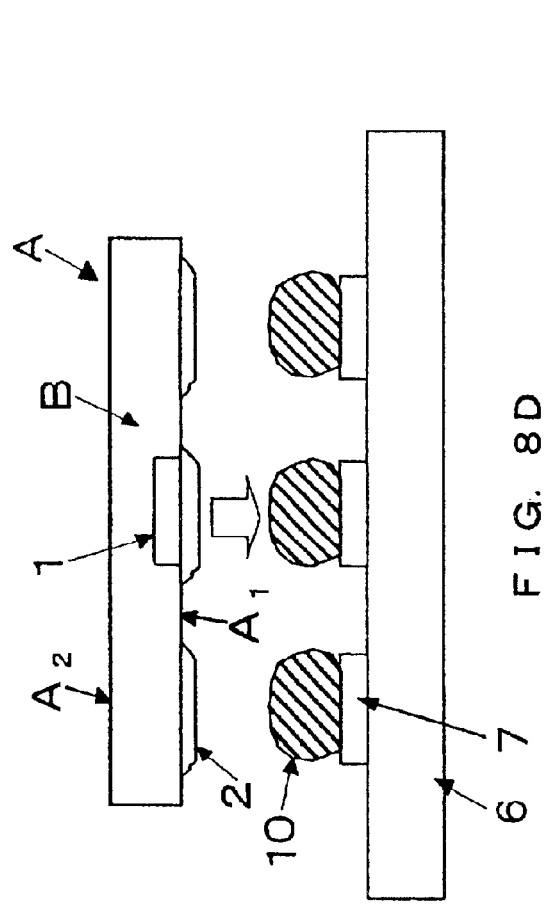
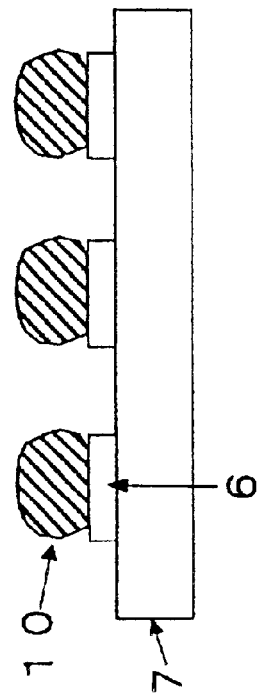
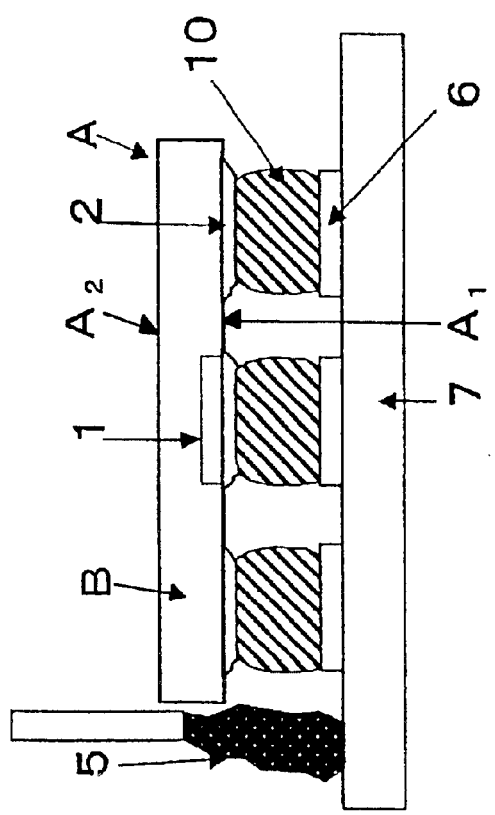
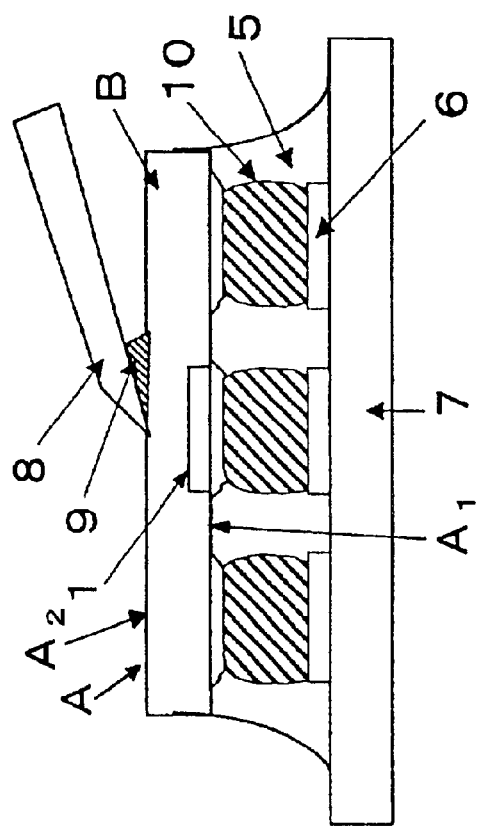

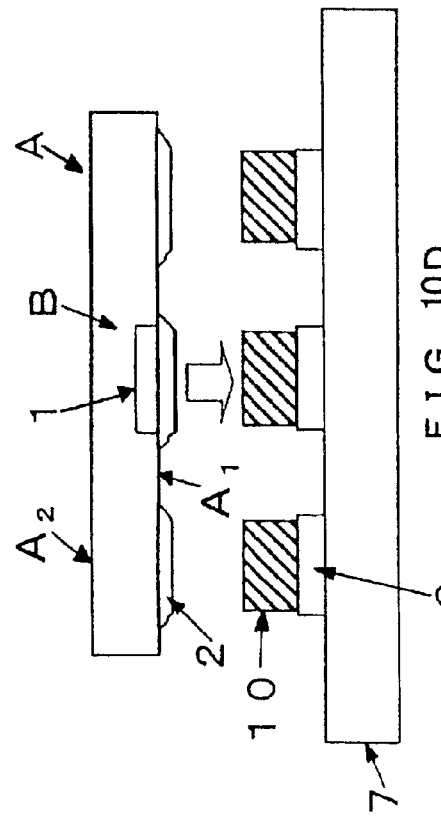
FIG. 10A
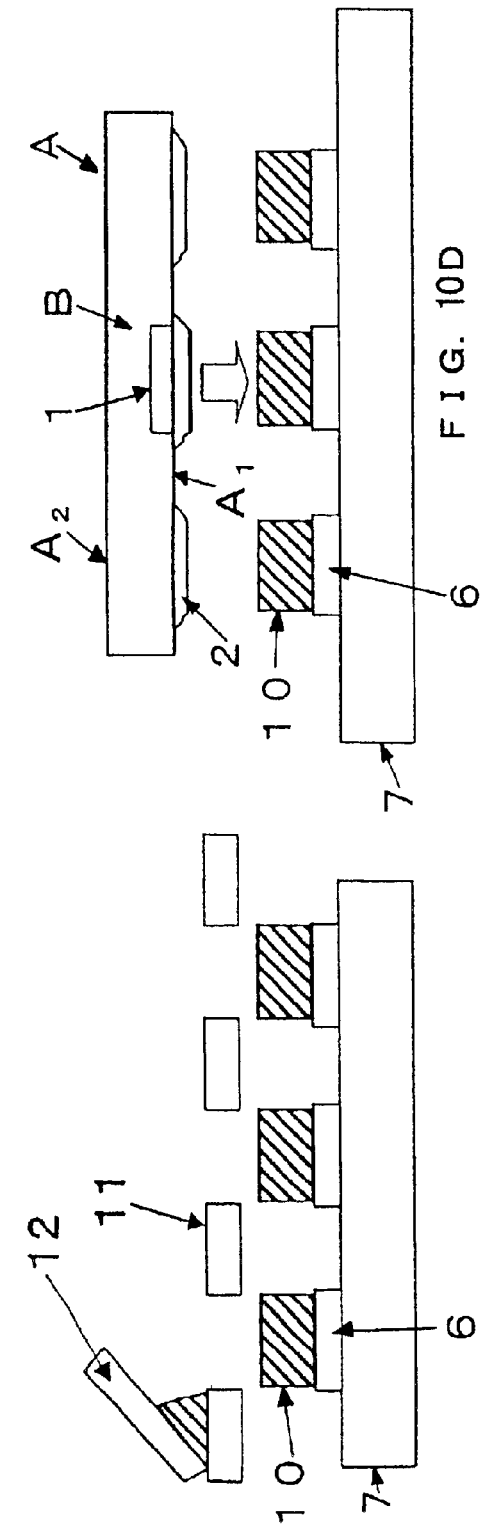
FIG. 10B
FIG. 10C
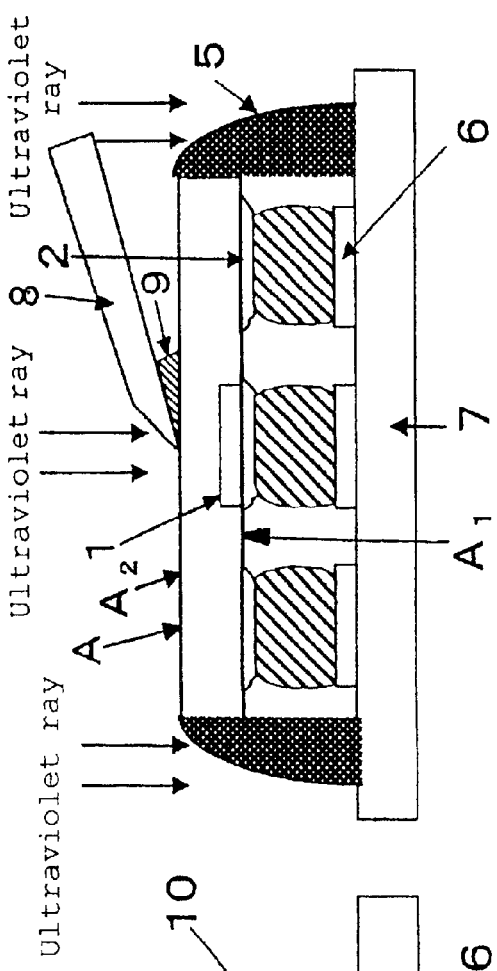
FIG. 10D
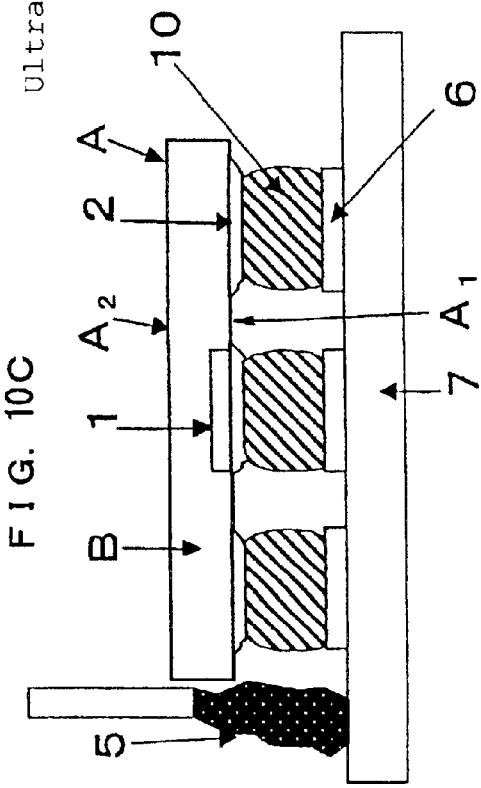

PHOTO-SEMICONDUCTOR MODULE AND METHOD FOR MANUFACTURING THE SAME

BACKGROUND OF THE INVENTION

1. Field of the Invention

The invention relates to a photo-semiconductor module and a method for manufacturing the same.

2. Description of the Related Art

The optical fiber features "small loss", "small diameter", and "light weight" to thereby reduce the loss significantly as compared to a conventional metallic cable. This difference is remarkable in high speed transmission of signals. To provide broadband services to the general homes in the near future, it is indispensable to develop a low-cost, high-band, and high-sensitivity light reception terminal (ONU: Optical Network Unit).

In realization of a low-cost, high-band, and high-sensitivity light reception terminal (ONU), a super-lattice avalanche photo-diode (hereinafter abbreviated as APD) and a Pin-photodiode (hereinafter abbreviated as PinPD) are drawing the attention from the industries as a photo-receptor element. These photo-receptor elements have been desired to be further improved in characteristics (especially high-frequency characteristic).

SUMMARY OF THE INVENTION

In view of the above, it is a main object of the invention to improve the high-frequency characteristic of a light-receiving photo-semiconductor device.

To achieve this object, in short, a photo-semiconductor module of the invention comprises a circuit board, a light-receiving photo-semiconductor device which is flip-chip-wise mounted on this circuit board, and an optical fiber which is fixed to the mounting face or its back face of the light-receiving photo-semiconductor device.

This configuration of the invention makes it possible to connect a light-receiving photo-semiconductor device to the circuit board with a short wiring distance, thus improving the high-frequency characteristic.

Also, the flip-chip-wise mounting method makes it possible to directly radiate heat from the back face of the light-receiving photo-semiconductor device, thus improving the hear radiation performance as compared to a conventional packaging method (by use of a resin-molded product).

Further, by the invention, an optical fiber can be slid on the mounting face or its back face of the light-receiving photo-semiconductor device so that it may be fixed at such a point thereon so as to give the largest light receiving sensitivity, in order to enable alignment while preserving sufficient output properties, thus reducing the manufacturing costs. In particular, the back face of a light-receiving photo-semiconductor device is mirror-face finished often, thus having good flatness originally. This feature facilitates alignment and fixing of an optical fiber onto the back face of the device, thus further improving the productivity.

To align an optical fiber to a light-receiving photo-semiconductor device, the optical fiber may expectedly slid in an alignment groove formed in the surface of the circuit board. By such a method, however, the groove must be machined at a high precision level and also be aligned with the light-receiving photo-semiconductor device at a high accuracy, thus contributing to an increase in the manufacturing costs. Such problems can be solved by the invention.

By the invention, the light-receiving photo-semiconductor device has a photo-absorbing layer formed therein, so that preferably the optical fiber is fixed as opposed to this photo-absorbing layer in a direction perpendicular to the mounting surface. Such a configuration improves the photo-absorbing efficiency.

By the invention, the circuit board has a connection electrode, so that preferably the input/output terminal electrodes of the light-receiving photo-semiconductor device are connected to this connection electrode via a protruding electrode and a conductive adhesive agent.

Also, by the invention, the circuit board has a connection electrode, so that preferably the input/output terminal electrodes of the light-receiving photo-semiconductor device are connected to this connection electrode via solder.

Such a configuration makes it possible to securely connect the device to the circuit board with a short wiring distance, thus further improving the high-frequency characteristic.

By the invention, preferably the surroundings of a connection between the input/output terminal electrodes and the connection electrode are encapsulated with an encapsulating resin. By doing so, a simple construction of resin encapsulation is enough to encapsulate the photo-semiconductor module, thus reducing the costs by that much.

In this case, to secure encapsulation, preferably the opposing portion between the light-receiving photo-semiconductor device and the circuit board except the connection between the input/output terminal electrodes and the connection electrode is encapsulated with the encapsulating resin.

By the invention, the back face is provided with a mounting hole toward the mounting face so that the optical fiber may preferably be inserted into it and fixed. This configuration facilitates and ensures the fixation of the optical fiber.

By the invention, preferably the mounting hole has such a depth that extends to a vicinity of the photo-absorbing layer of the light-receiving photo-semiconductor device. Thus, the photo-absorbing efficiency can be improved further.

By the invention, preferably the light-receiving photo-semiconductor device employs a compound semiconductor substrate having a Pin-photodiode. By thus using the Pin-photodiode, it is possible to obtain a photo-semiconductor module stable in characteristics and reliabilities.

In this case, the circuit board has a connection electrode, so that preferably the connection electrode connected to either one of the P-side electrode and the N-side electrode of the Pin-photodiode is provided at such a site on the circuit board that is opposed to a periphery of the light-receiving photo-semiconductor device. Such a configuration suppresses the occurrence of a floating capacitance between the connection electrode of the circuit board and the light-receiving photo-semiconductor device, thus further improving the high-frequency characteristic.

By the invention, an auxiliary mounting plate with a through-hole is further comprised, so that preferably the auxiliary mounting plate is fixed to the back face with the optical fiber as inserted and fixed to the through-hole to thereby fix the optical fiber to the light-receiving photo-semiconductor device, thus facilitating and securing the fixation of the optical fiber.

In this case, preferably an encapsulating resin is comprised to encapsulate the surroundings of a connection between the input/output terminal electrodes and the connection electrode to thereby fix the auxiliary mounting plate to the back face with this encapsulating resin, thus further facilitating and securing the fixation of the optical fiber.

A photo-semiconductor module of the invention can be manufactured by a method comprising the steps of: forming a protruding electrode on the input/output terminal electrode provided on the mounting face to then give a conductive adhesive agent to this protruding electrode; installing the light-receiving photo-semiconductor device to the circuit board in such a manner that the input/output terminal electrode may butt against the connection electrode provided on the circuit board; hardening the conductive adhesive agent to mount the light-receiving photo-semiconductor device to the circuit board; encapsulating a connection site between the light-receiving photo-semiconductor device and the circuit board with an encapsulating resin; and fixing an optical fiber to the back face.

Similarly, a photo-semiconductor module of the invention can be manufactured by a method comprising the steps of: supplying solder to a connection electrode provided on the circuit board; installing the light-receiving photo-semiconductor device to the circuit board in such a manner that the input/output terminal electrode provided on the mounting face may butt against the connection electrode; melting the solder to mount the light-receiving photo-semiconductor device to the circuit board, encapsulating a connection site between the light-receiving photo-semiconductor device and the circuit board with an encapsulating resin; and fixing an optical fiber to the back face.

In this case, preferably a photo-hardening resin is used as the optical-fiber fixing adhesive agent and the encapsulating resin to thereby photo-harden both these encapsulating resin and optical-fiber fixing resin simultaneously, thus simplifying the step of hardening these resins.

Also, to use a compound semiconductor substrate having a Pin-photodiode to make the light-receiving photo-semiconductor device thereon, preferably the protruding electrode is formed on the terminal electrode with both the shorter-side faces of the compound semiconductor substrate as sandwiched by a jig to thereby enable avoiding damaging of the light-receiving photo-semiconductor device made of even such a relatively brittle substance as a compound semiconductor substrate.

Also, to mount a light-receiving photo-semiconductor device to the circuit board using solder, preferably heat and load are inflicted on the solder to thereby produce a diffused compound between the solder and the input/output terminal electrode, thus enabling securely interconnecting the connection electrode and the input/output terminal electrode without performing an extra step of applying flux to the solder.

BRIEF DESCRIPTION OF THE DRAWINGS

The other objects of the invention will be more apparent from the following description and the appended claims. The many advantages not referred to in this specification will come up to the mind of those skilled in the art by carrying out the invention taken in conjunction with the accompanying drawings, in which:

FIG. 1 is a cross-sectional view for showing a construction of a photo-semiconductor module according to a first preferred embodiment of the invention;

FIGS. 2A through 2C-2 are graphs for showing characteristics data of the photo-semiconductor module according to the first preferred embodiment;

FIGS. 3A–3E are schematic diagrams for showing a method for manufacturing the photo-semiconductor module according to the first preferred embodiment;

FIGS. 8A–8D are schematic diagrams for showing a second method for manufacturing the photo-semiconductor module according to the second preferred embodiment;

FIGS. 10A–10D are schematic diagrams for showing a method for manufacturing the variant of the photo-semiconductor module according to the second preferred embodiment;

DESCRIPTION OF THE PREFERRED EMBODIMENTS

Figure 4:
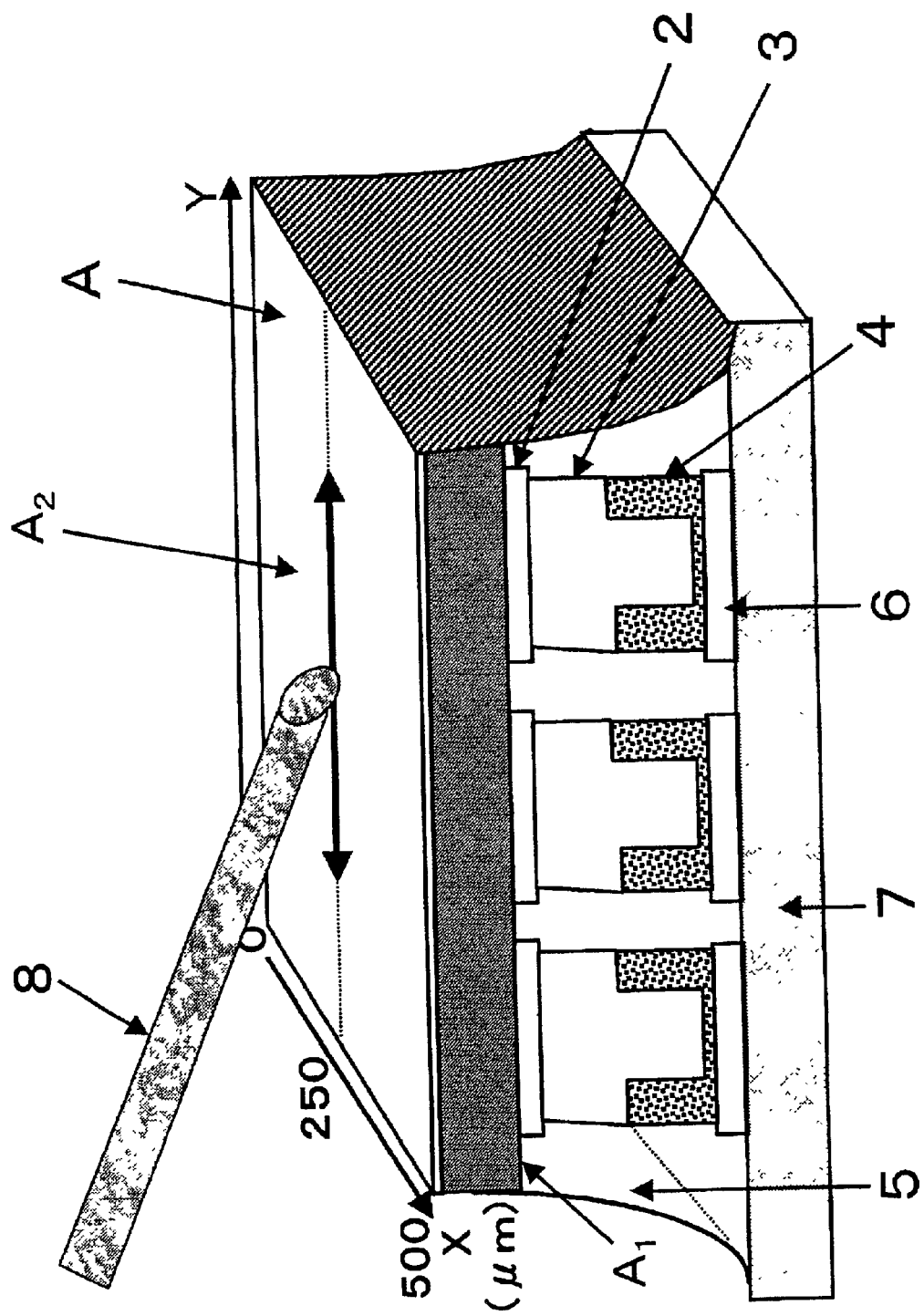
FIG. 4 is a perspective view for outlining a method for aligning an optical fiber.

The following will describe preferred embodiments of the invention with reference to the drawings.

First Embodiment

FIG. 1 outlines a photo-semiconductor module according to the first preferred embodiment of the invention. This photo-semiconductor module has a light-receiving photo-semiconductor device A formed on a compound semiconductor substrate B. The compound semiconductor substrate B is made of an InP substrate etc., in which is provided a Pin-photodiode 1 (hereinafter abbreviated as PinPD), which is a photoreceptor element. On the pin junction of the PinPD 1 is applied a backward high voltage applied to pn junction to thereby accelerate an electron-hole pair generated in the photo-absorbing layer of the PinPD1. A mounting face $A_1$ of the light-receiving photo-semiconductor device A is provided with an input/output terminal electrode 2.

On the input/output terminal electrode 2 is formed a protruding electrode 3. The protruding electrode 3 is electrically connected and fixed onto a connection electrode 6 of a circuit board 7 via a conductive adhesive agent 4. A connection between the input/output terminal electrode 2 and the connection electrode 6 (opposing portion between the circuit board 7 and the compound semiconductor substrate B) is encapsulated and reinforced by an encapsulating resin 5. This causes the light-receiving photo-semiconductor device A to be mounted to the circuit board 7. Note here that the encapsulating resin 5 only needs to reinforce at least the surroundings of the connection. Also, the protruding electrode 3 may be formed by wire bonding, plating, or any other method.

Thus, the light-receiving photo-semiconductor device A having the PinPD1 thereon is mounted flip-chip-wise to the circuit board 7. On a back face $A_2$ (opposite to the mounting face $A_1$) of the mounting face $A_1$ (on which the input/output terminal electrode is formed) of the light-receiving photo-semiconductor device A is adhered and fixed an optical fiber 8. In this embodiment, a tip of the optical fiber 8 is adhered to the light-receiving photo-semiconductor device A using an adhesive agent 9 made of a thermo-hardening resin etc. Note here that to efficiently guide light into the PinPD1, the tip of the optical fiber 8 is positioned as opposed to the photo-absorbing layer of the PinPD1.

Such a configuration of this embodiment makes it possible to connect the light-receiving photo-semiconductor device A to the circuit board 7 with a short wiring distance. This enables realizing a photo-semiconductor module excellent in high-frequency characteristic. Also, by mounting the light-receiving photo-semiconductor device A flip-chip-wise, heat can be directly radiated from the mounting face $A_1$ of this device to the circuit board 7, thus providing a construction excellent also in hear radiation performance as compared to a conventional package construction (of a resin-molded product) Further, the optical fiber 8 can be slid on the back face $A_2$ to thereby fix at such a position as to provide a largest light receiving sensitivity, so that it can be aligned easily to also preserve an excellent light receiving characteristic. In particular, the back face $A_2$ of the light-receiving photo-semiconductor device A is often mirror-face finished to preserve good flatness, thus increasing the productivity of the photo-semiconductor module.

Note here that to align the optical fiber 8 with the light-receiving photo-semiconductor device A, a groove may expectedly be formed in the surface of the circuit board 7 so that the optical fiber 8 may be slid therein. Such a configuration, however, needs to give a high precision level in machining of the groove as well as in alignment thereof with the light-receiving photo-semiconductor device A, thus contributing to an increase in the manufacturing costs. To solve this problem completely, there is provided such a configuration as to fix the optical fiber 8 to the back face $A_2$ of the light-receiving photo-semiconductor device A.

The following will investigate a light-receiving photo-semiconductor device to be realized by the invention. In such a light-receiving photo-semiconductor device as a PinPD or APD, because of its construction, light is received in the thickness direction of a stack layer constituting the semiconductor device but not in the film face direction of the stack film. In the light-receiving photo-semiconductor device, generally, the mounting face $A_1$ is formed in parallel with the face direction of the stack film. In the light-receiving photo-semiconductor device having such features by the invention, the optical fiber 8 is fixed to the mounting face $A_1$ to thereby obtain the above-mentioned effects. To realize the invention, therefore, there is no need at all to change the basic construction of the light-receiving photo-semiconductor device, thus facilitating the realization that much.

In contrast to the case of the light-receiving photo-semiconductor device, in a light-emitting photo-semiconductor device, light is emitted in a direction (which is perpendicular to the thickness direction) parallel to the film face direction of the stack film constituting the photo-semiconductor device but not in a direction (which is parallel to the thickness direction) perpendicular to the film face direction of the stack film. However, like in the case of the light-receiving photo-semiconductor device, in the light-emitting photo-semiconductor device generally, the mounting face $A_1$ is formed in parallel to the face direction of the stack film. To realize the light-emitting photo-semiconductor device having such features of the invention, therefore, there is need to change the basic construction of the light-emitting photo-semiconductor device in a respect of using as the mounting face such a face that is perpendicular to the film face direction of the stack film of the semiconductor device.

Note here that although this embodiment interconnects the light-receiving photo-semiconductor device A and the circuit board 7 using the protruding electrode 3 and the conductive adhesive agent 4, the invention is not limited thereto; for example, any method may be employed such as interconnection by use of a protruding electrode and solder, an anisotropic conductive film (ACF), anisotropic conductive paste (ACP), solder and solder, or a metal and a metal.

The following will describe a result of measuring the reliability of the photo-semiconductor module of this embodiment with reference to FIGS. 2. In measurement, the following was used as one example of this embodiment. That is, such a light-receiving photo-semiconductor A was prepared that incorporates the PinPD1 on the compound semiconductor substrate B made of a 0.1 $\mu$m-thick InP substrate, in which the protruding electrode 3 was formed by wire bonding on the input/output terminal electrode 2 of this light-receiving photo-semiconductor device A. By mounting the light-receiving photo-semiconductor device A to the connection electrode 6 of the circuit board 7 via the protruding electrode 3 and the conductive adhesive agent 4, the photo-semiconductor module is made. The inventor measured the photo-semiconductor module having such a configuration of the embodiment.

FIG. 2A indicates a result of measuring an increase in the dark current when a solder heat test (270° C., 5 cycles) was conducted under the conditions of a reverse-bias application voltage of 0–15V. FIG. 2B indicates a result of measuring an increase of the dark current when a high-temperature, high-humidity test was conducted under the conditions of a temperature of 85° C., a humidity of 85%RH, and a time of 1712 hours. FIGS. 2C-1 and 2C-2 indicate a result of measuring an increase in the dark current when a temperature cycle test (−40° C. to 125° C.) was conducted 400 cycles.

As can be seen from the data of FIG. 2, the photo-semiconductor module of this embodiment exhibited little deterioration in the dark current, proving an excellent reliability of the construction of this embodiment. This is considered to be partly because the light-receiving photo-semiconductor device A is connected to the circuit board 7 with a short wiring distance. Besides, it may be also because the light-receiving photo-semiconductor device A is mounted via the conductive adhesive agent 4 to the circuit board 7, so that this mounting requires only a relatively small application pressure (40 g/terminal electrode for the formation of the protruding electrode and 5 g/terminal electrode for the mounting), thus avoiding damaging the light-receiving photo-semiconductor device A.

Preferably, the photo-absorbing layer of the PinPD1 is made of any combination of at least II-group elements of Zn, Cd, and Hg, III-group elements of B, Al, Ga, In, and Tl, V-group elements of N, P, As, Sb, and Bi, and VI-group elements of O, S, Se, Te, and Po. Also, preferably a conductive filler of the conductive adhesive agent 4 contains at least one of Ag, Pd, Ni, Au, Cu, C, and Pt. Preferably the encapsulating resin 5 contains an epoxy-based resin as its main component and also inorganic particulate. The inorganic particulate includes $SiO_2$, $Al_2O_3$, SiN, AlN etc.

The following will describe the reasons for using the compound semiconductor substrate B having the built-in PinPD1 as the light-receiving photo-semiconductor device A in this embodiment and the various embodiments of the invention explained below.

A super-lattice avalanche photodiode (APD) has a basic operating principle of ionization-rate ratio control through band discontinuity of the super-lattice construction; in face, an APD formed on a silicon (Si) substrate is commercially available already. The APD formed on a silicon (Si) substrate, however, has no sensitivity in the 1.55-$\mu$m band and 1.3-$\mu$m band for use in signal transfer by use of an optical fiber.

To solve this problem, such a configuration of the APD has been proposed that InGaAs(P)/InAlAs-based and In(Al)GaAs/InAlAs-based materials are lattice-matched on an InP substrate. This APD has proved to be of a high gain-bandwidth product and a high sensitivity in these signal transfer bands.

As disclosed in many literatures, however, when an electron-hole pair produced in the photo-absorbing layer is accelerated at the immediate strong electric field for avalanche multiplication, the electron and the hole are both multiplied, thus making it impossible to obtain a good high-frequency characteristic.

To solve this problem, such a construction is considered that the photo-absorbing layer and the avalanche multiplication layer are separated from each other to thereby implant only electrons into the multiplication layer, thus multiplying the electrons selectively. In this construction, however, electrons in the valence band of an electric-field relaxation layer will tunnel into the conduction band of the super-lattice multiplication layer owing to the strong electric field, thus contributing to the occurrence of a dark current wave.

Further, as a premise, the APD is to be air-tight encapsulated in a package, employing such a packaging scheme that, for example, a whole device is put in a case and then encapsulated air-tight in order to prevent as much as possible a water content from entering the package. This packaging, however, stands a bottleneck in manufacturing the APD at a low cost.

Thus, there are many problems of the APD to solve in terms of characteristic and reliability, thus preventing the APD from being put to practical use to an acceptable level. Also, the construction of encapsulating the device as contained in a case for air-tightness is a hindrance in cost reduction. Also, the mesa-type construction suffers from especially a difficulty in control of an interfacial level of the mesa-etching portion, thus deteriorating the dark current. To guard against this, a passivation film must be formed indispensably but prevents an optimal construction from being obtained.

A PinPD, on the other hand, is generally formed on a compound semiconductor substrate specifically by a vapor-phase or liquid-phase growing method in manufacture, so that it is stable and has by far good reliabilities as compared to the APD. However, it does not have a super-lattice multiplication layer and so has no carrier multiplication action, thus suffering from a problem of a small margin in specifications for obtaining higher performance.

To solve this problem, the invention employs a PinPD stable in characteristic and reliability although its potential characteristics are inferior to an PAD because it has no carrier multiplication action, thus realizing a photo-semiconductor module further improved in characteristic and reliability.

The following will describe a method for manufacturing a photo-semiconductor module according to this embodiment with reference to FIG. 3.

First, as shown in FIG. 3A, the protruding electrode 3 is formed on the input/output terminal electrode 2 of the light-receiving photo-semiconductor device A. Next, as shown in FIG. 3B, the conductive adhesive agent 4 is formed to a constant thickness in position in a container C and then a tip of the protruding electrode 3 is dipped in this conductive adhesive agent 4, thus transferring the conductive adhesive agent 4 to the protruding electrode 3.

Next, as shown in FIG. 3C, the input/output terminal electrode 2 is connected and fixed to the connection electrode 6 via the conductive adhesive agent 4, thus mounting the light-receiving photo-semiconductor device A to the circuit board 7. Then, as shown in FIG. 3D, the surroundings of a connection at the opposing portion between the circuit board 7 and the compound semiconductor substrate B are encapsulated and reinforced with the encapsulating resin 5. In this step, the encapsulating resin 5 needs only to reinforce the surroundings of the connection.

Finally, as shown in FIG. 3E, the optical fiber 8 is positioned on a photo-absorbing layer of the light-receiving photo-semiconductor device A (specifically the PinPD1) in such a manner as to maximize the photo-absorbing efficiency for the PinPD1 and then is adhered and fixed to the back face $A_2$ of the light-receiving photo-semiconductor device A using the adhesive agent 9 such as a thermo-hardening resin.

The optical fiber 8 can thus be fixed along the back face $A_2$ of the light-receiving photo-semiconductor device A as follows. That is, the optical fiber 8 can be slid on the back face $A_2$ of the light-receiving photo-semiconductor device A in positioning to thereby be fixed at such a position that the light-receiving photo-semiconductor device A has a maximum light receiving sensitivity. Thus, the photo-semiconductor module can be manufactured with a good characteristic as held for the light-receiving photo-semiconductor device A. Moreover, the optical fiber 8 can thus be positioned easily, thereby reducing the manufacturing costs that much. In particular, the back face $A_2$ of the light-receiving photo-semiconductor device A is mirror-face finished often and so has good flatness preserved. This further improves the accuracy of and facilitates the positioning of the optical fiber 8.

Figure 5:
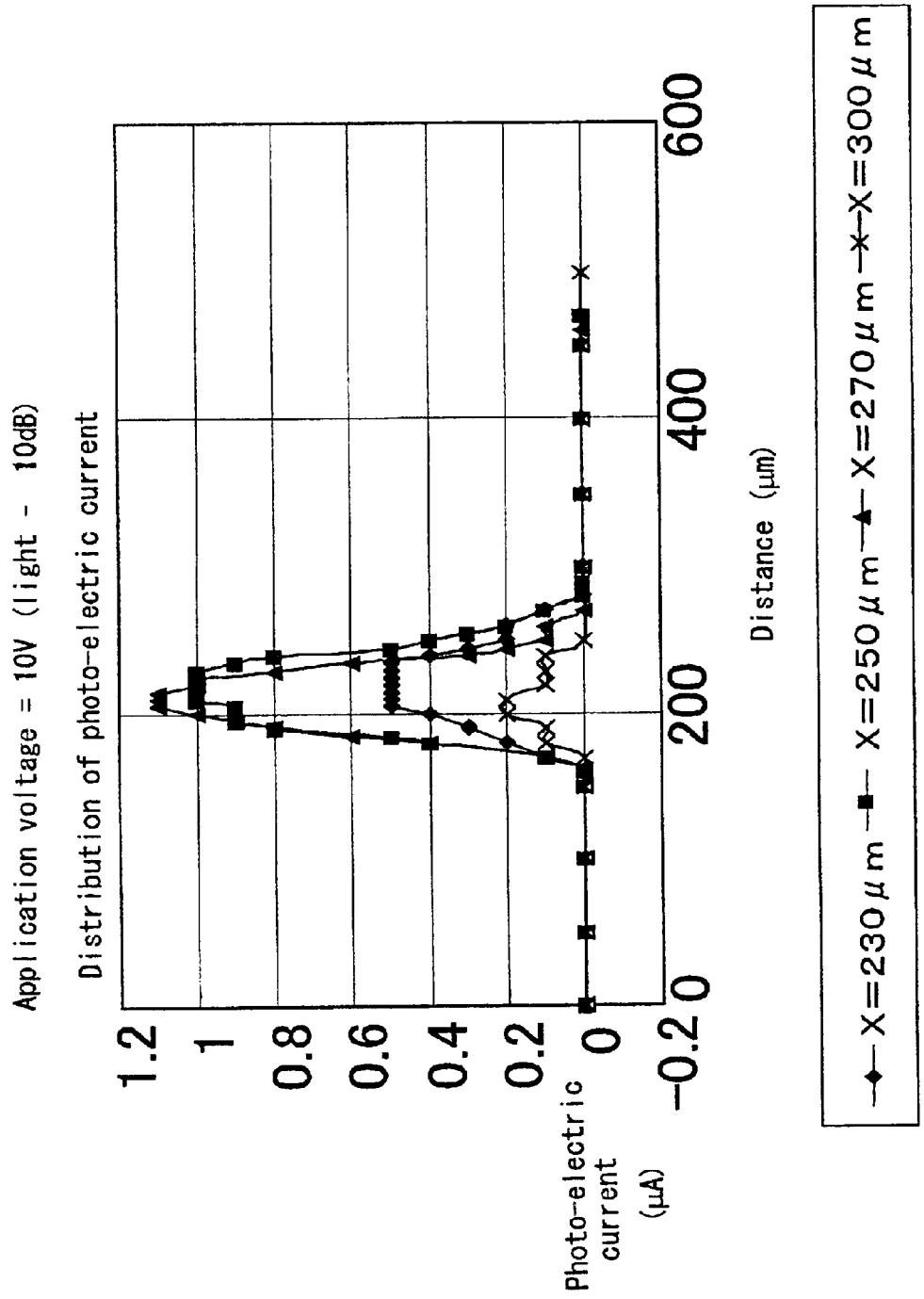
FIG. 5 is a graph for showing a change in a photoelectric current vs. movement of the optical fiber.

FIGS. 4 and 5 show the data obtained as a result of measuring the placing of the optical fiber 8 at such a position as to maximize a light receiving sensitivity of the light-receiving photo-semiconductor device A which was measured as sliding the optical fiber 8 on the back face $A_2$. FIG. 4 is a perspective view for showing a state where the optical fiber 8 was slid on the back face $A_2$ of the light-receiving photo-semiconductor device A and FIG. 5, a graph in which the changes observed in this measurement of the light receiving sensitivity are superposed one on another. In FIG. 5, the ♦, ■, ∆, and X marks indicate the photo-electric current values output from the light-receiving photo-semiconductor device A when the optical fiber 8 was moved from an origin point shown in FIG. 4A in the X-axial direction by as much as respective distance (♦=230 µm, ■=250 µm, ∆=270 µm, X=300 µm) and moved in the Y-axial direction by as much respective distances. As can be seen from FIG. 5, the light is converted into an electric current most and so the current flows most at such a position that the sensitivity hits the peak. In this example, the light receiving sensitivity hits the peak at a position where the optical fiber moved 270 µm along the X-axis and 210 µm along the Y-axis.

Note here that since the position of the photo-absorbing layer can be known already when the light-receiving photo-semiconductor device is designed, the optical fiber 8 can be moved near such a place on the back face $A_2$ that the photo-absorbing layer is suspected to be present while measuring the value of a resultant photo-electric current, thus efficiently determining the point where the light receiving sensitivity becomes maximum.

Second Embodiment

Figure 6:
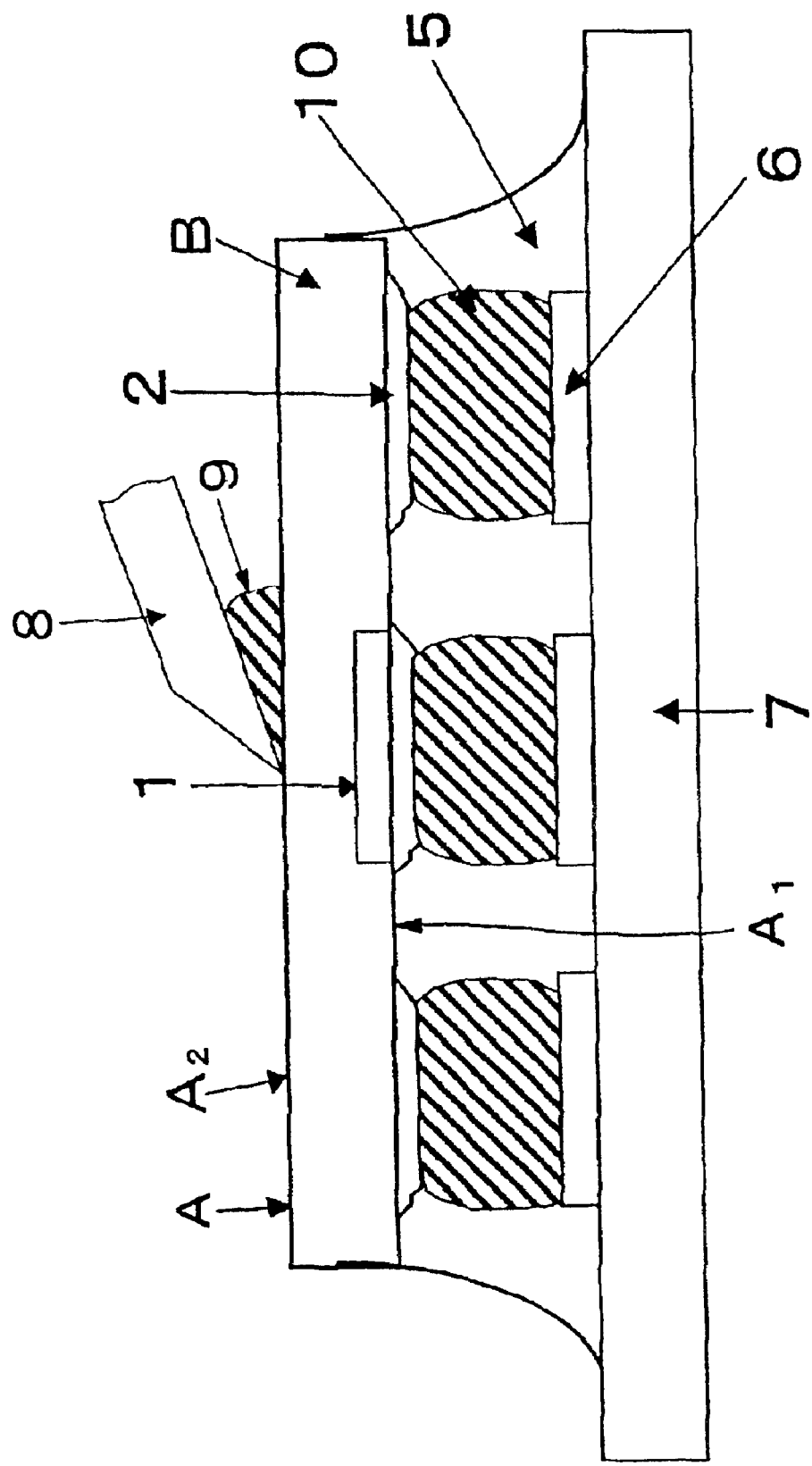
FIG. 6 is a cross-sectional view for showing a construction of the photo-semiconductor module according to a second preferred embodiment of the invention.

Although the first embodiment described above has used the conductive adhesive agent 4 to mount the light-receiving photo-semiconductor device A to the circuit board 7, the present invention is not limited to use of such an adhesive agent. As shown in FIG. 6, the second embodiment uses solder 10 in place of the conductive adhesive agent 4 to thereby connect and fix the input/output terminal electrode 2 of the light-receiving photo-semiconductor device A to the connection electrode 6 of the circuit board 7. Moreover, in a construction of this embodiment, the device is mounted using only the solder 10 without providing the protrusion electrode 3. The other construction details are basically the same as those of the first embodiment and so their explanation is omitted. Also, the encapsulating resin 5 need not be used for reinforcement if the reliability can be preserved for thermal distortion to which are related the size of the light-receiving photo-semiconductor device A and the material of the compound semiconductor substrate B. Also, preferably the solder 10 contains at least one of Sn, Ag, Pb, Bi, Cu, Zn, and Sb.

The following will describe a first method for manufacturing the photo-semiconductor module according to this embodiment with reference to FIGS. 7.

Figure 7A:
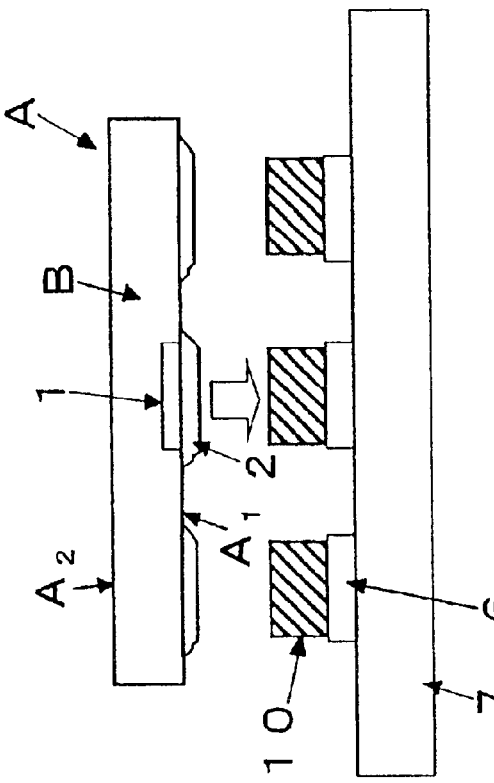
FIGS. 7A–7D are schematic diagrams for showing a first method for manufacturing the photo-semiconductor module according to the second preferred embodiment.

First, as shown in FIG. 7A, the solder 10 is supplied by printing to the connection electrode 6 of the circuit board 7. Specifically, the solder 10 is supplied through a screen mask 11 using a squeegee 12 to the surface of the connection electrode 6.

Figure 7B:
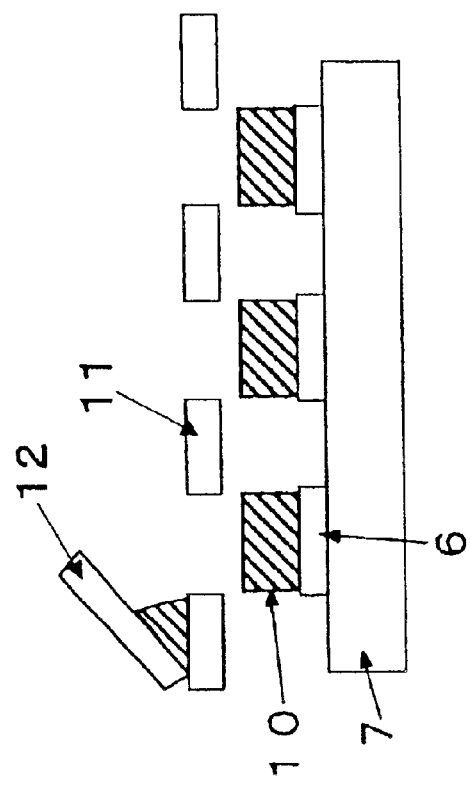

Next, as shown in FIG. 7B, the input/output terminal electrode 2 is aligned with the connection electrode 6 to then mount the light-receiving photo-semiconductor device A on the circuit board 7 and, in this state, conduct reflow processing, etc. to thereby melt the solder 10, thus connecting the input/output terminal electrode 2 to the connection electrode 6.

Figure 7C:
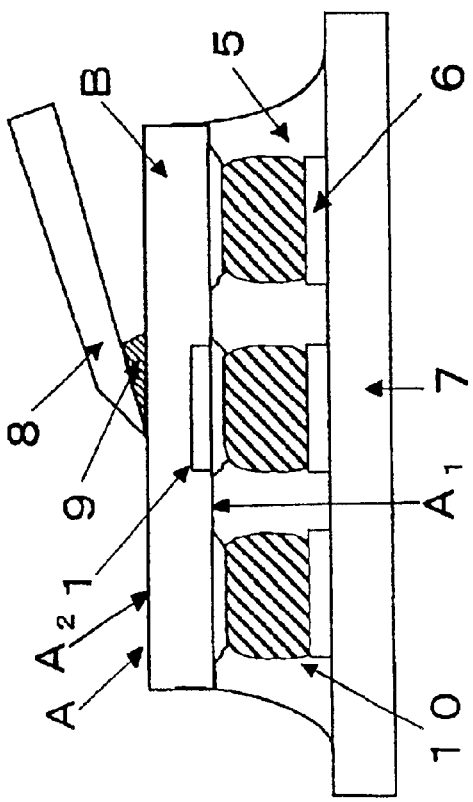

Next, as shown in FIG. 7C, the encapsulating resin 5 is used to encapsulate the connection for reinforcement. In this step, the encapsulating resin 5 needs only to reinforce at least the surroundings of the connection. Also, the encapsulating resin 5 need not be used for reinforcement if the reliability can be preserved for the thermal distortion to which are related the size of the light-receiving photo-semiconductor device A, the materials of the compound semiconductor substrate B and the circuit board 7, etc.

Figure 7D:
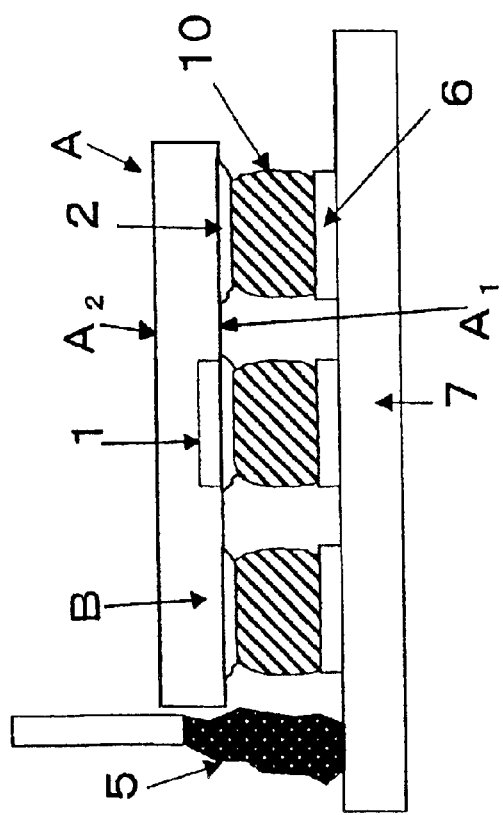

Finally, as shown in FIG. 7D, the optical fiber 8 is positioned on the back face $A_2$ of the light-receiving photo-semiconductor device A so that the photo-absorbing layer of the light-receiving photo-semiconductor device A may have the maximum photo-absorbing efficiency and then adhered to the light-receiving photo-semiconductor device A using the adhesive agent 9.

The following will describe a second method for manufacturing the photo-semiconductor module according to this embodiment with reference to FIG. 8.

First, as shown in FIG. 8A, the solder 10 is formed by plating on the connection electrode 6 of the circuit board 7. Then, as shown in FIG. 8B, the input/output terminal electrode 2 of the light-receiving photo-semiconductor device A is connected and fixed to the connection electrode 6 of the circuit board 7 using both heat and load. In this step, the solder 10 has its surface oxide film broken by the heat and load to thereby produce a metallic compound between itself and the input/output terminal electrode 2. This process serves to interconnect the input/output terminal electrode 2 and the connection electrode 6 both mechanically and electrically.

Next, as shown in FIG. 8C, the connection between the light-receiving photo-semiconductor device A and the circuit board 7 is encapsulated and reinforced by the encapsulating resin 5. In this step, the encapsulating resin 5 needs only to reinforce the surroundings of the connection. Also, the encapsulating resin 5 need not be used for reinforcement if the reliability can be preserved for thermal distortion to which are related the size of the light-receiving photo-semiconductor device A and the material of the compound semiconductor substrate B and the circuit board 7.

Finally, as shown in FIG. 8D, the optical fiber 8 is positioned on the back face $A_2$ of the light-receiving photo-semiconductor device A so that the photo-absorbing layer of the light-receiving photo-semiconductor device A may have the maximum photo-absorbing efficiency and then is adhered to the light-receiving photo-semiconductor device A using the adhesive agent 9.

Figure 9:
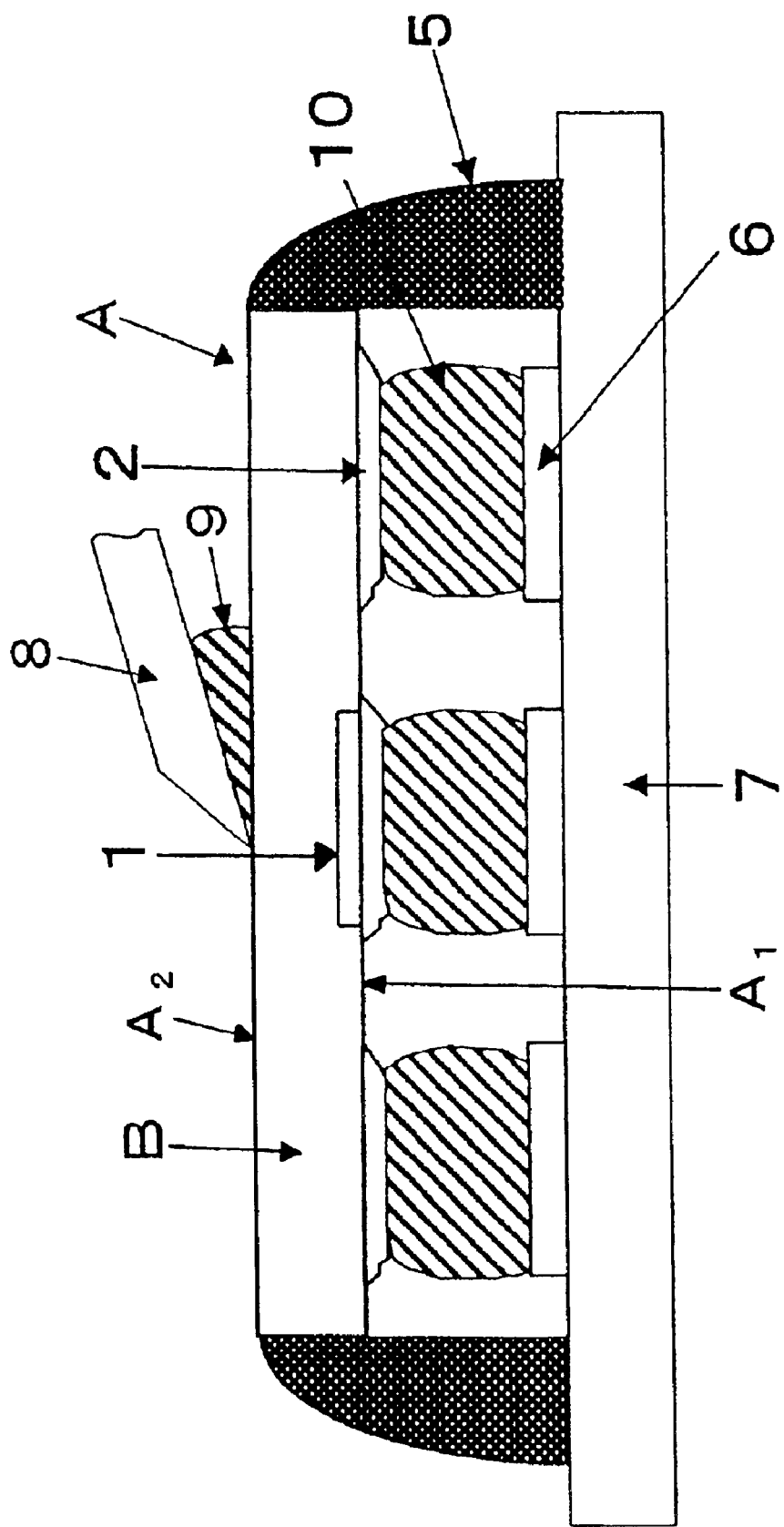
FIG. 9 is a cross-sectional view for showing a variant of the photo-semiconductor module according to the second preferred embodiment.

Although this embodiment described above has supplied the encapsulating resin to cover and thereby reinforce the connection between the light-receiving photo-semiconductor device A and the circuit board 7, the encapsulating resin 5 may be supplied only to the periphery of the light-receiving photo-semiconductor device A as shown in FIG. 9.

The following will describe the method for manufacturing a photo-semiconductor module in FIG. 9 with reference to FIG. 10. First, the light-receiving photo-semiconductor device A is mounted to the circuit board 7 according to the method shown in FIGS. 10A and 10B same as that described with reference to FIGS. 7A and 7B. Then, the encapsulating resin 5 made of a photo-hardening resin (e.g., ultraviolet-hardening resin) is placed as unhardened at the periphery of the light-receiving photo-semiconductor device A at the connection between the light-receiving photo-semiconductor device A and the circuit board 7. In this state, the optical fiber 8 is further abutted to and placed on the back face $A_2$ of the light-receiving photo-semiconductor device A via the adhesive agent 9 made of a similar photo-hardening resin (as unhardened).

Then, an ultraviolet ray is applied to the encapsulating resin 5 and the adhesive agent 9 simultaneously to thereby harden only the surfaces of the encapsulating resin 5 and the adhesive agent 9. By doing so, the optical fiber 8 can be properly positioned while simultaneously preventing the encapsulating resin 5 from flowing into the connection. Then, the encapsulating resin 5 and the adhesive agent 9 are heated to be hardened permanently.

Third Embodiment

Figure 11:
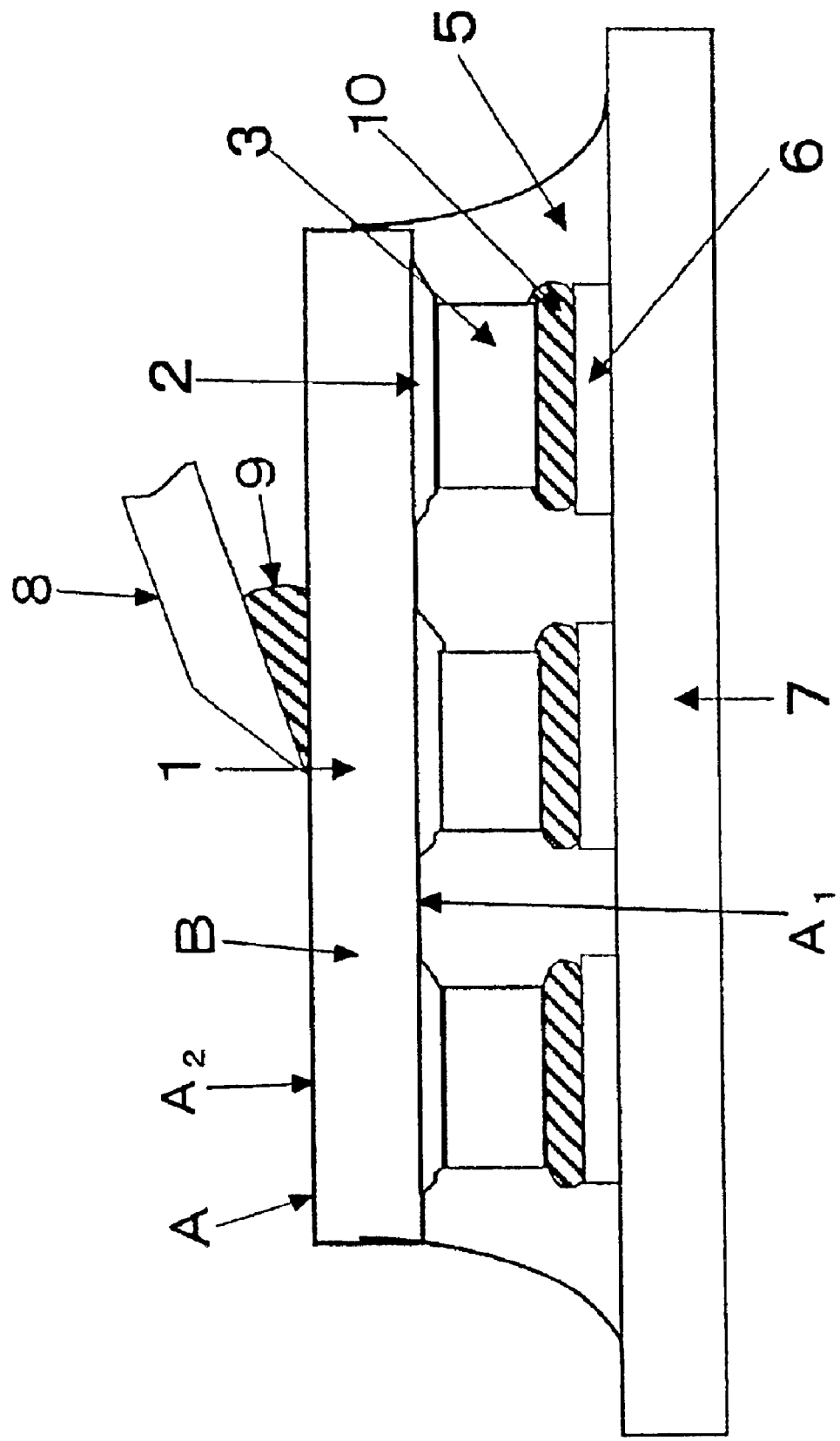
FIG. 11 is a cross-sectional view for showing a construction of the photo-semiconductor module according to a third preferred embodiment of the invention.

Although the second embodiment described above has used only the solder 10 to mount the light-receiving photo-semiconductor device A to the circuit board 7, the present invention is not limited to use of such an adhesive medium. As by third embodiment, as shown in FIG. 11, the protruding electrode 3 is formed on the input/output terminal electrode 2 to then connect and fix the input/output terminal electrode 2 of the light-receiving photo-semiconductor device A to the connection electrode 6 of the circuit board 7 by interposing the solder 10 between the protruding electrode 3 and the connection electrode 6. The solder 10 is specifically formed as pasted on the connection electrode 6 of the circuit board 7 and then melted by reflow processing to thereby connect and fix the connection electrode 6 and the input/output terminal electrode 2 to each other. Alternatively, the solder 10 may be formed to the connection electrode 6 without supplying flux to then has oxide film of the solder 10 broken using heat and load simultaneously in order to produce a metallic compound between the solder 10 and the protruding electrode 3, thus connecting and fixing the connection electrode 6 and the input/output terminal electrode 2 to each other.

The other construction details are basically the same as those of the first embodiment and their explanation is omitted. Also, the encapsulating resin 5 need not be used for reinforcement if the reliability can be preserved for thermal distortion to which are related the size of the light-receiving photo-semiconductor device A and the material of the compound semiconductor substrate B. Also, preferably the solder 10 contains at least one of Sn, Ag, Pb, Bi, Cu, Zn, and Sb.

The above-mentioned first through third embodiments of the present invention have their respective features in the construction for interconnecting the light-receiving photo-semiconductor device A and the circuit board 7. The following will describe fourth through sixth embodiments of the present invention which have their respective features in the optical fiber 8 installing construction and seventh and eighth embodiments of the present invention which further have the other features.

Note here that the embodiments to be described as follows have no features in particular in the construction for interconnecting the light-receiving photo-semiconductor device A and the circuit board 7. Therefore, a connection portion between the light-receiving photo-semiconductor device A and the circuit board 7 is simply called a connection 14. The connection 14 here, of course, contains a construction for connection by use of the conductive adhesive agent 4 or the solder 10.

Fourth Embodiment

Figure 12:
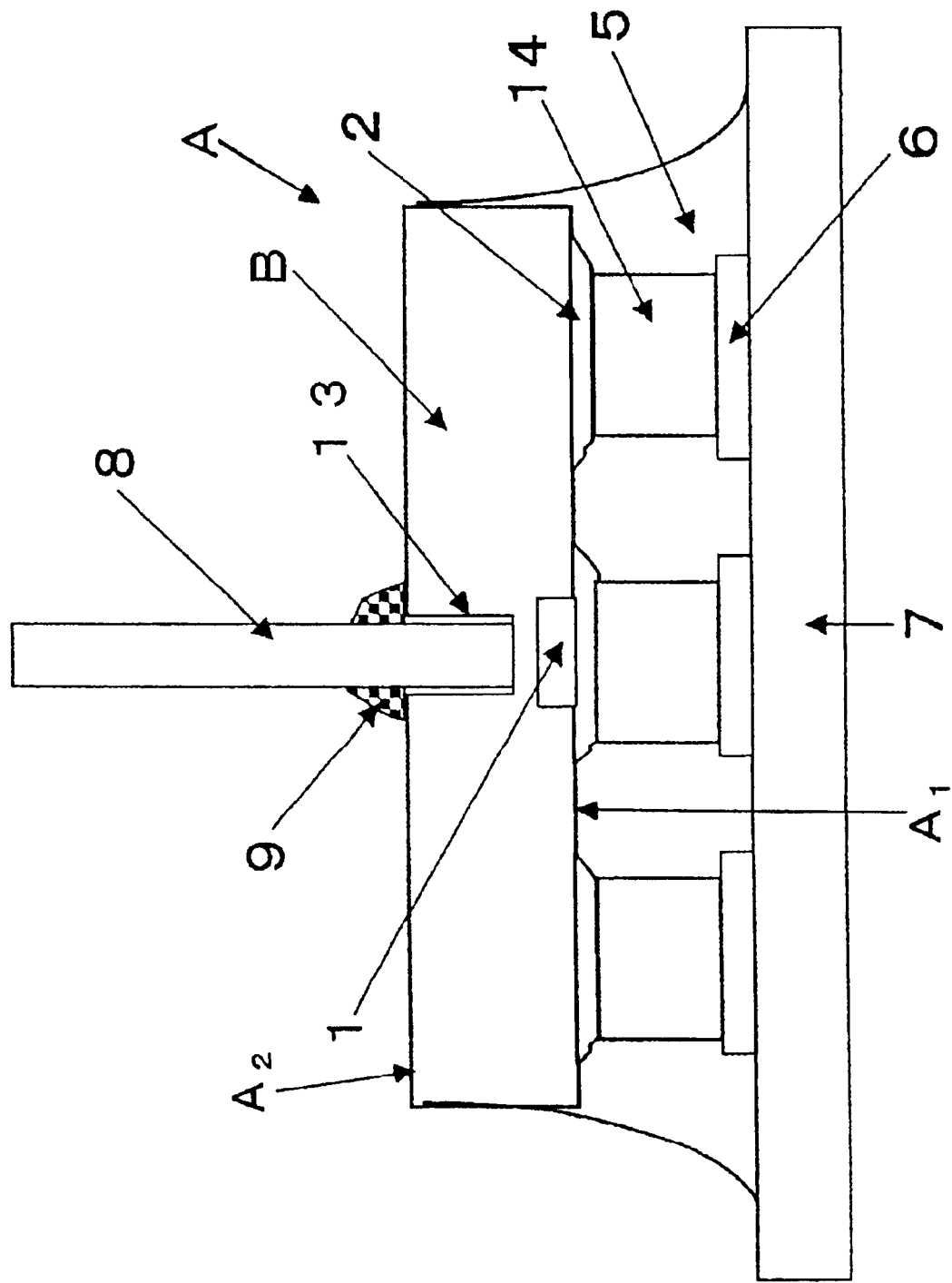
FIG. 12 is a cross-sectional view for showing a construction of the photo-semiconductor module according to a fourth preferred embodiment of the invention.

FIG. 12 outlines the photo-semiconductor module according to the fourth embodiment. In this photo-semiconductor module, the light-receiving photo-semiconductor device A is mounted via the connection 14 to the circuit board A, the back face $A_2$ of which has a mounting hole 13 formed therein. The mounting hole 13 is formed as bottomed along the thickness direction of the substrate B toward the mounting face $A_1$ (on which the terminal electrode is formed) and to such a size that the optical fiber 8 can be inserted therein.

The tip of the optical fiber 8 is fixed, as inserted in the mounting hole 13, to the light-receiving photo-semiconductor device A using the adhesive agent 9. This configuration permits the tip of the optical fiber 8 to come close to the photo-absorbing layer of the PinPD1 as much as possible, thus preserving a sufficient level of light receiving sensitivity.

Fifth Embodiment

Figure 13:
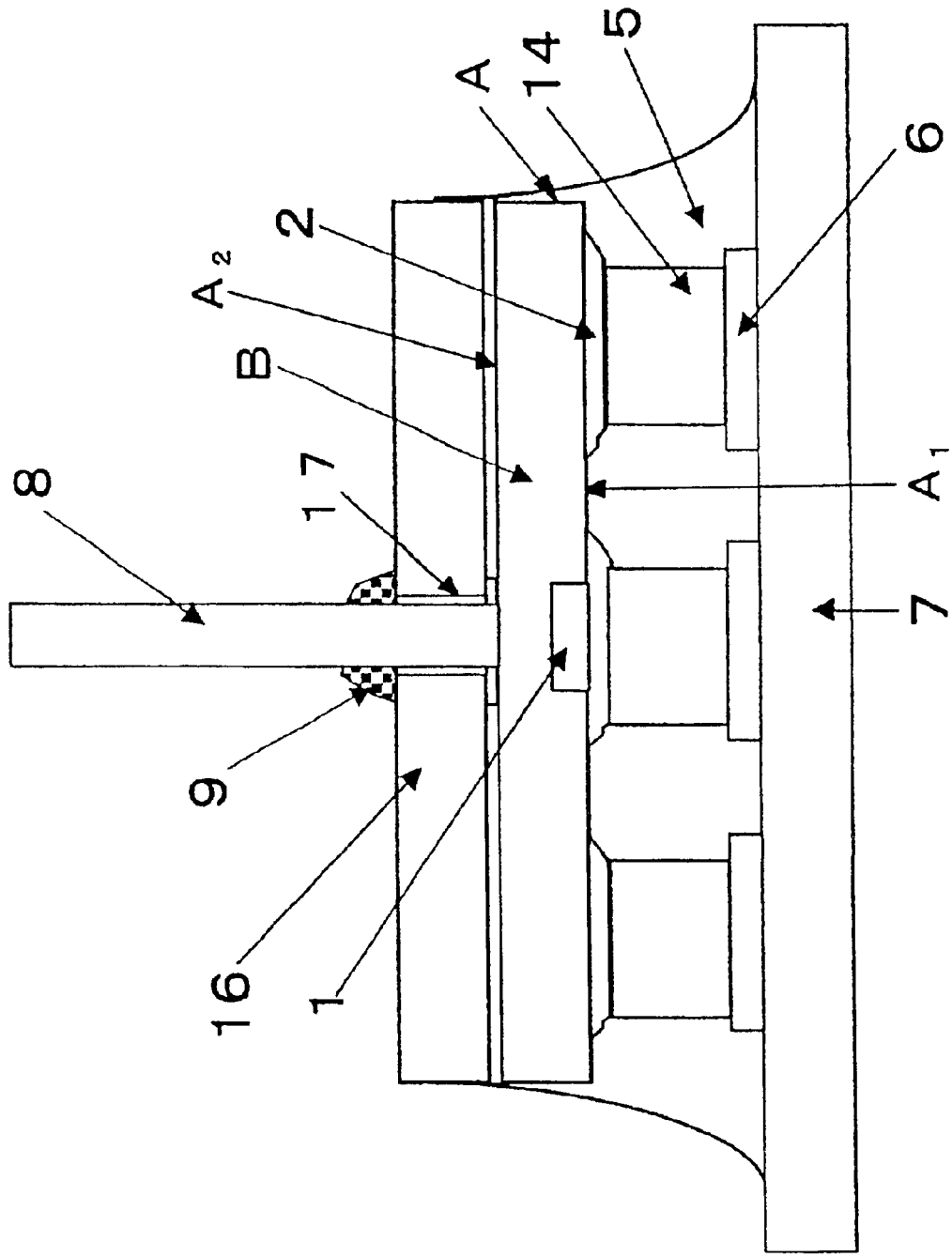
FIG. 13 is a cross-sectional view for showing a construction of the photo-semiconductor module according to a fifth preferred embodiment of the invention.

FIG. 13 outlines the photo-semiconductor module according to the fifth embodiment of the present invention. In this photo-semiconductor module, the light-receiving photo-semiconductor device A is mounted via the connection 14 to the circuit board A, to the back face $A_2$ of which is fixed face-to-face an auxiliary mounting plate 16. The auxiliary mounting plate 16 has a mounting hole 17 formed along its thickness direction. The mounting hole 17 is specifically formed through the auxiliary mounting plate 16 and to such a size that the optical fiber 8 can be inserted therein.

The tip of the optical fiber 8 is fixed, as inserted in the mounting hole 17, to the auxiliary mounting plate 16 using the adhesive agent 9, to thereby fix the optical fiber 8 via the auxiliary mounting plate 16 to the light-receiving photo-semiconductor device A. This configuration permits the auxiliary mounting plate 16 to enhance the mechanical strength of the light-receiving photo-semiconductor device A (compound semiconductor substrate B), thus making the thickness of the light-receiving photo-semiconductor device A (compound semiconductor substrate B) thin that much. By this embodiment, therefore, the thickness of the light-receiving photo-semiconductor device A can be thus decreased to thereby permit the tip of the optical fiber 8 to come close to the photo-absorbing layer of the PinPD1 by that much, thus preserving a sufficient level of the light receiving sensitivity.

Figure 14:
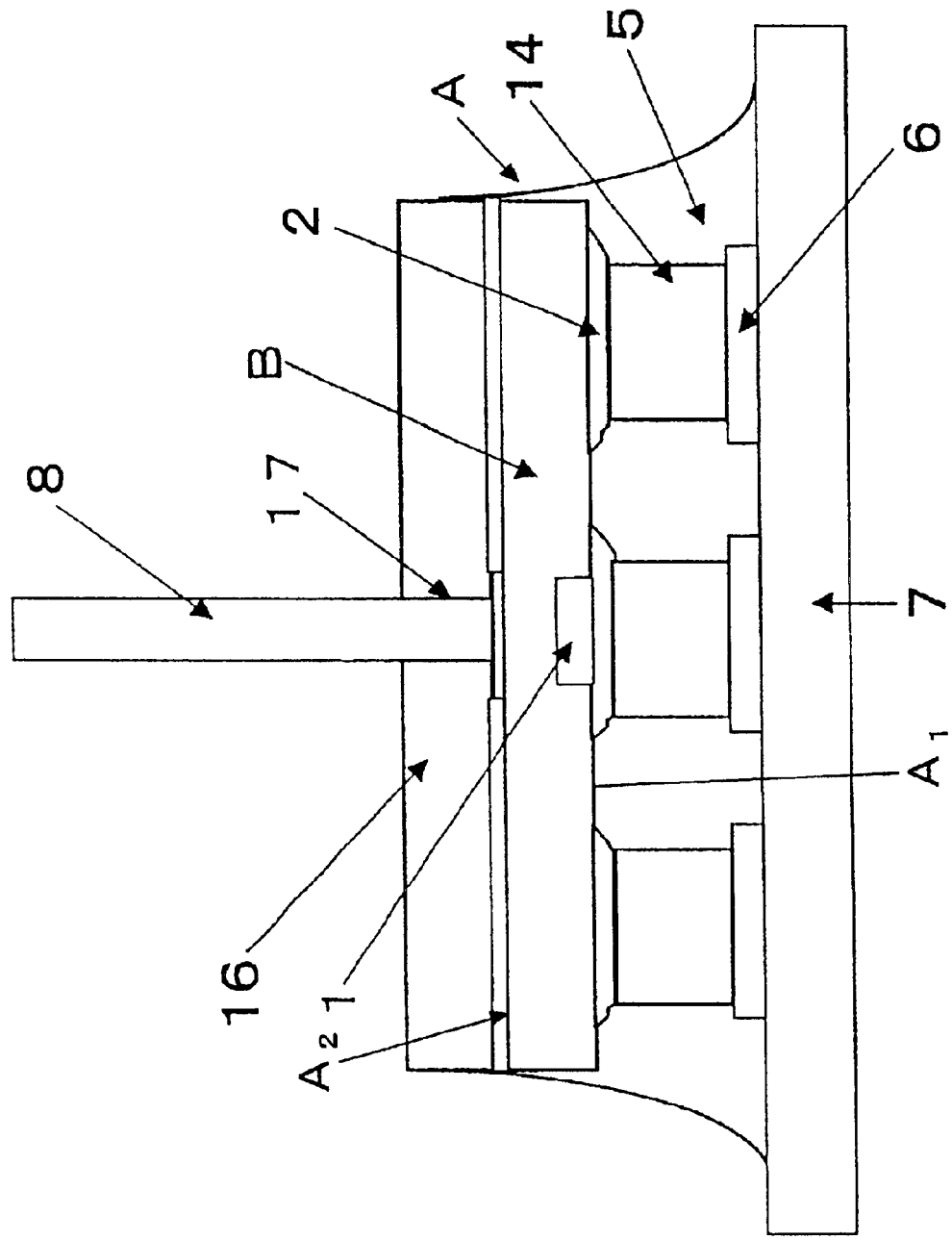
FIG. 14 is a cross-sectional view for showing a variant of the photo-semiconductor module according to the fifth preferred embodiment.

Alternatively, as shown in FIG. 14, the size of the mounting hole 17 may mostly match the profile of the optical fiber 8 to thereby fix the optical fiber 8 by pressure into the mounting hole 17.

Also, the auxiliary mounting plate 16 of this embodiment can be installed and fixed using the encapsulating resin 5 to thereby eliminate the independent step of installing the auxiliary mounting plate 16 in order to simplify the manufacturing process, thus reducing the costs.

Sixth Embodiment

Figure 15:
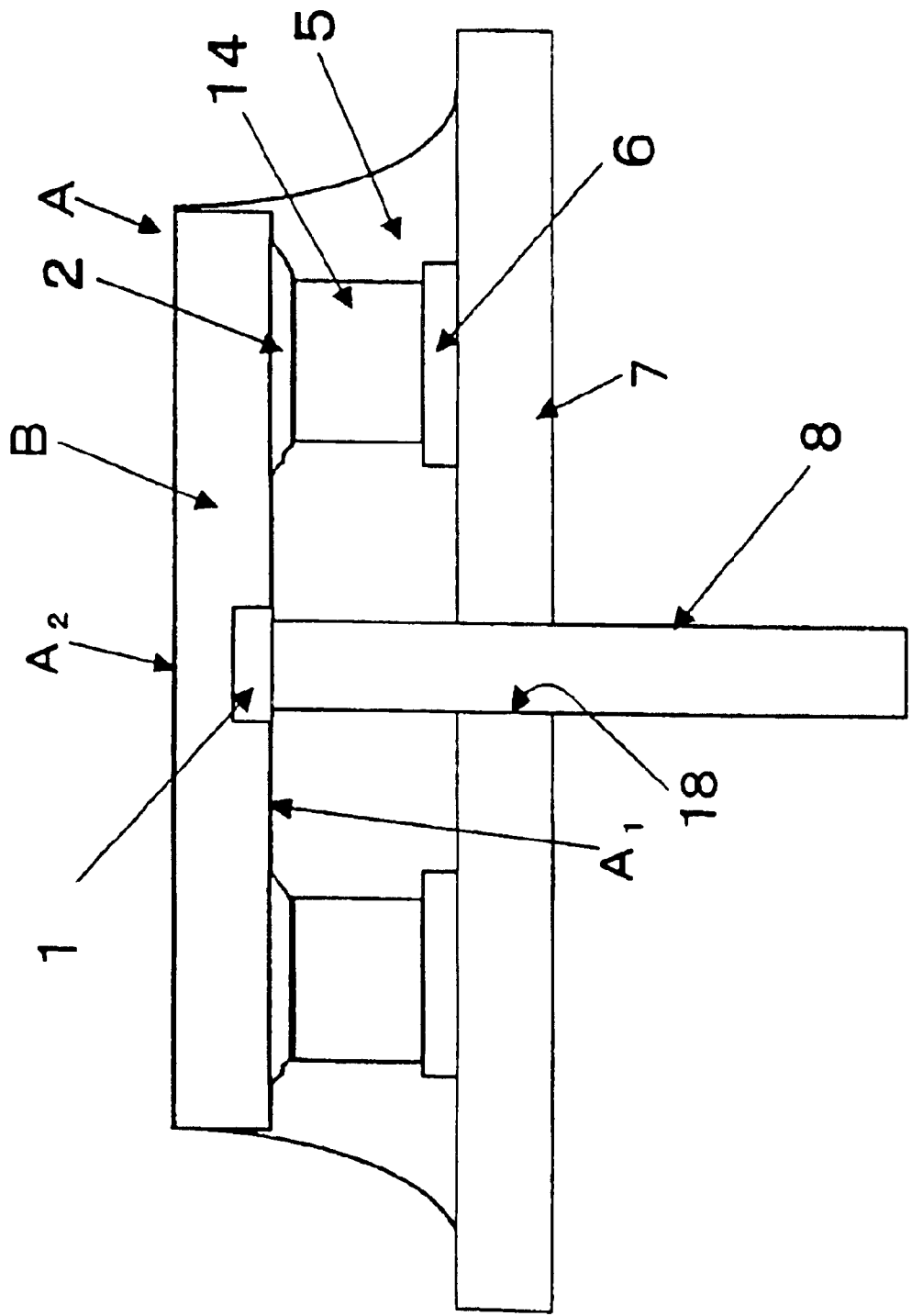
FIG. 15 is a cross-sectional view for showing a construction of the photo-semiconductor module according to a sixth preferred embodiment of the invention.

FIG. 15 outlines the photo-semiconductor module according to the sixth embodiment of the present invention. In this photo-semiconductor module, the light-receiving photo-semiconductor device A is mounted via the connection 14 to the circuit board 7, in which in turn is formed a mounting hole 18. The mounting hole 18 is formed through the circuit board 7 along the thickness direction of the circuit board 7 and to such a size that the optical fiber 8 can be inserted therein.

The tip of the optical fiber 8 is fixed, as inserted in the mounting hole 18, to the light-receiving photo-semiconductor device A on its mounting face $A_1$ (on the face on which the input/output terminal electrode is formed) using the encapsulating resin 5. This configuration permits the tip of the optical fiber 8 to come close to the photo-absorbing layer of the PinPD1 as much as possible, thus preserving a sufficient level of light receiving sensitivity.

Figure 16:
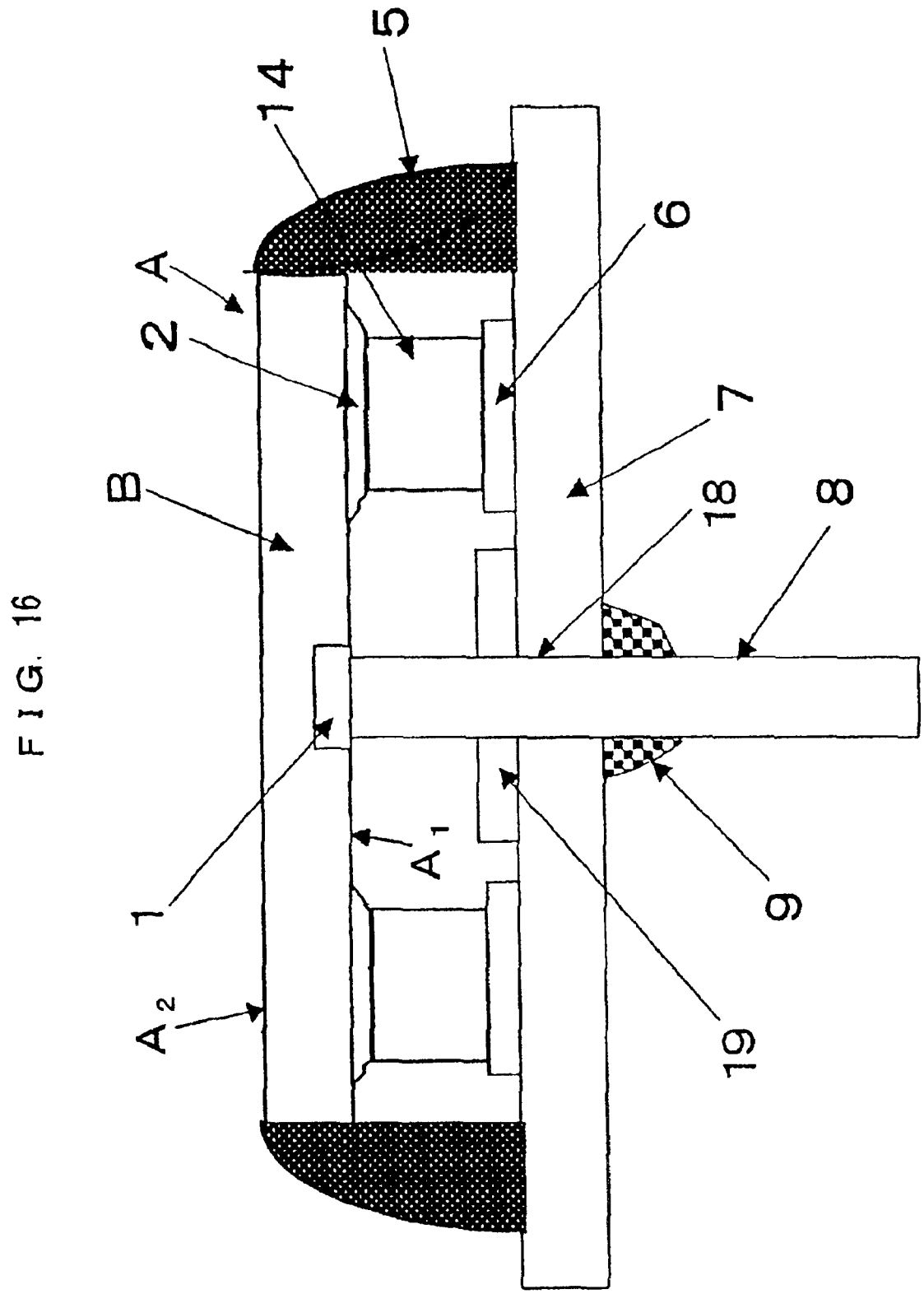
FIG. 16 is a cross-sectional view for showing a variant of the photo-semiconductor module according to the sixth preferred embodiment.

Alternatively, as shown in FIG. 16, on either one of the right and back faces of the circuit board 7 (on the face on which the input/output terminal electrode is formed in FIG. 16) a positioning block 19 may be disposed so as to surround the mounting hole 18. This configuration facilitates the positioning of the optical fiber 8. The positioning block 19 may be a resist, a chip element, or any other as far as it does not interfere with the wiring circuit on the circuit board 7. In the construction shown in FIG. 16, the optical fiber 8 is fixed with the adhesive agent 9 and the encapsulating resin 5 is provided only at the periphery of the light-receiving photo-semiconductor device A. This is, however, just one example and, of course, the surroundings of the connection 14 may be encapsulated completely with the encapsulating resin 5 or the optical fiber 8 may be fixed by pressure into the mounting hole 18.

Seventh Embodiment

Figure 17B:
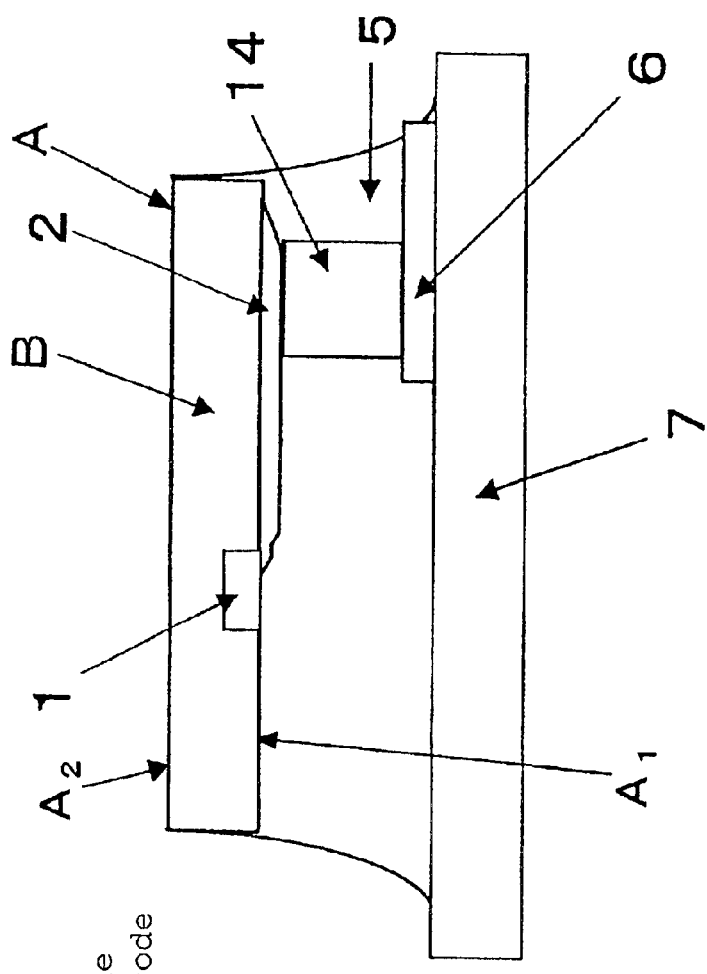
FIGS. 17A and 17B are schematic diagrams for showing a construction of the photo-semiconductor module according to a seventh preferred embodiment of the invention.
Figure 17A:
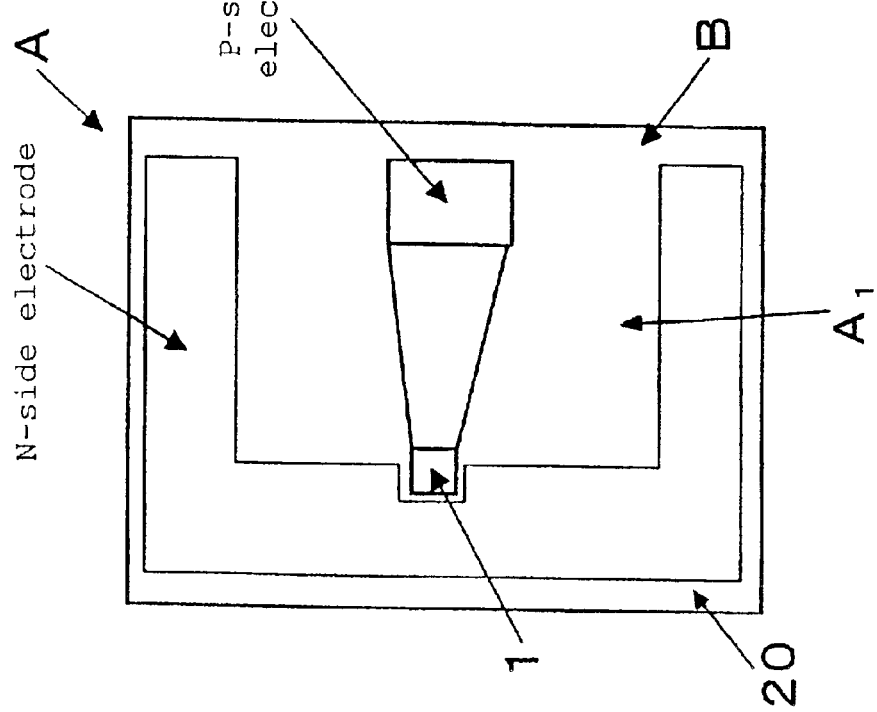

FIG. 17 outline the photo-semiconductor module according to the seventh embodiment of the present invention. FIG. 17A shows a wiring electrode 20 of the light-receiving photo-semiconductor device A as viewed from the above and FIG. 17B is a cross-sectional view for showing the light-receiving photo-semiconductor device A as mounted to the circuit board 7.

The light-receiving photo-semiconductor device A may sometimes have such a configuration that the underlying compound semiconductor substrate B as a whole acts as the N-side electrode, so that if the connection 14 extended from the P-side electrode is present at the center of the light-receiving photo-semiconductor device A, a floating capacitance may possibly occur there between the connection electrode 6 of the circuit board 7 pulled around thereto and the compound semiconductor substrate B underlying the light-receiving photo-semiconductor device A which acts as the N-side electrode. Such a floating capacitance may deteriorate the high-frequency characteristic remarkably. To solve this problem, in this embodiment, as shown in FIG. 17B, the connection electrode 6 of the circuit board 7 connected to the connection 14 which acts as the P-side electrode is disposed outside the light-receiving photo-semiconductor device A as much as possible in design. This configuration makes it possible to prevent characteristics from being deteriorated due to the occurrence of the floating capacitance, thus realizing the photo-semiconductor module excellent in high-frequency characteristic.

Figure 18:
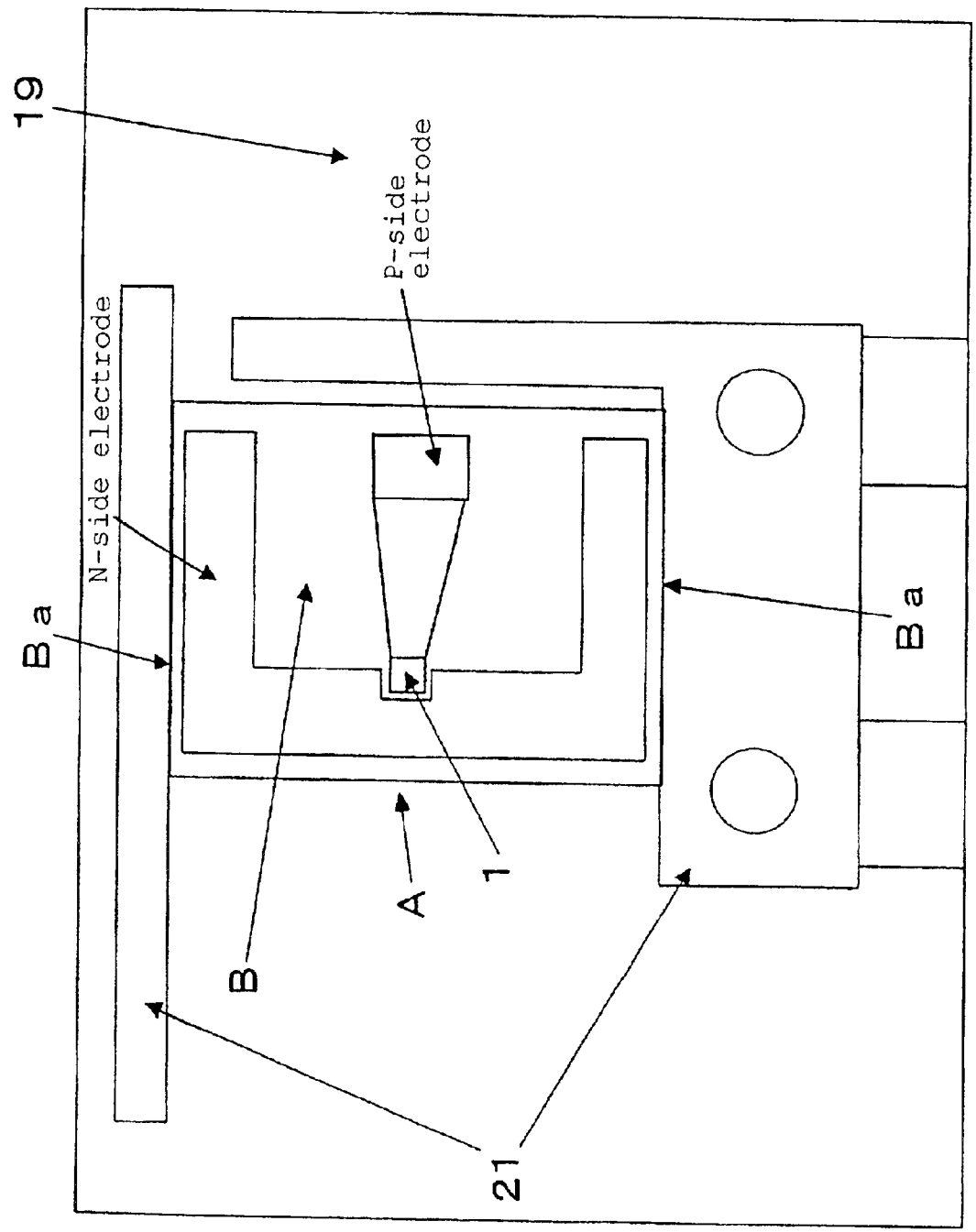
FIG. 18 is a schematic diagram for showing a construction of a variant related to all the embodiments of the invention.

Note here that the compound semiconductor substrate B has a cleavage face and so is brittle and fragile as compared to a silicon (Si) substrate. Therefore, when the protruding electrode 3 needs to be provided in any of the embodiments of the present invention, an attempt to form the protruding electrode 3 using the wire bonding method may sometimes cause damage on the compound semiconductor substrate B. In such a case, as shown in FIG. 18, the side of the shorter-side Ba of the compound semiconductor substrate B can be sandwiched by a jig 21 to then form the protruding electrode 3 by wire bonding to thereby remarkably mitigate damage (cracks etc.) on the compound semiconductor substrate B, thus further preventing the deterioration in the high-frequency characteristic and the current characteristic (dark current, photo-electric current, etc.) of the light-receiving photo-semiconductor device. Note here that a reference numeral 19 in FIG. 18 indicates a bonding stage.

As may be clear from the explanation above, the invention provides a flip-chip mounting construction in packaging to thereby air-tight encapsulation by use of an encapsulating resin, thus eliminating the necessity of otherwise encapsulating in an air-tight manner by use of a package construction. This technology is not established yet conventionally. This new technology enables reducing the costs. Also, a photo-semiconductor module can be realized which is excellent in the high-frequency characteristic, the current characteristic (dark current, photo-electric current, etc.) and reliability.

Also, the light-receiving photo-semiconductor device of the invention can be manufactured in such stable processes as the vapor-phase growing method or liquid-phase growing method to thereby be free of characteristic deterioration due to humidity in contrast to a prior art one, thus providing a further stabled mounting construction.

While there has been described in detail what is at present considered to be the most preferable embodiments of the present invention, it will be understood that various modifications of the combination and arrangement of the elements may be made therein without departing from the spirit and scope of the present invention claimed.

What is claimed is:

1. A photo-semiconductor module comprising:
   a circuit board;
   a light-receiving photo-semiconductor device mounted on said circuit board in a flip-chip manner; and
   an optical fiber fixed to a mounting face of said light-receiving photo-semiconductor device or a back face of said mounting face.

2. The photo-semiconductor module according to claim 1, wherein said light-receiving photo-semiconductor device has a photo-absorbing layer, so that said optical fiber is fixed at a position opposite to said photo-absorbing layer along a direction perpendicular to said mounting face.

3. The photo-semiconductor module according to claim 1, wherein said circuit board has a connection electrode, so that an input/output terminal electrode of said light-receiving photo-semiconductor device provided on said mounting face is connected to said connection electrode via a protruding electrode and a conductive adhesive agent.

4. The photo-semiconductor module according to claim 3, wherein surroundings of a connection between said input/output terminal electrode and said connection electrode are encapsulated by an encapsulating resin.

5. The photo-semiconductor module according to claim 4, wherein an opposing portion between said light-receiving photo-semiconductor device and said circuit board except said connection is encapsulated by said encapsulating resin.

6. The photo-semiconductor module according to claim 1, wherein said circuit board has a connection electrode, so that an input/output terminal electrode of said light-receiving photo-semiconductor device provided on said mounting face is connected to said connection electrode via solder.

7. The photo-semiconductor module according to claim 6, wherein surroundings of a connection between said input/output terminal electrode and said connection electrode are encapsulated by an encapsulating resin.

8. The photo-semiconductor module according to claim 7, wherein an opposing portion between said light-receiving photo-semiconductor device and said circuit board except said connection is encapsulated by said encapsulating resin.

9. The photo-semiconductor module according to claim 1, wherein said optical fiber is fixed to said back face using an adhesive resin.

10. The photo-semiconductor module according to claim 9, wherein said back face is provided with a mounting hole formed therein toward said mounting face, in which mounting hole is inserted and fixed said optical fiber.

11. The photo-semiconductor module according to claim 10, wherein said mounting hole has such a depth that extends to a vicinity of a photo-absorbing layer of said light-receiving photo-semiconductor device.

12. The photo-semiconductor module according to claim 9, further comprising an auxiliary mounting plate having a though-hole therein, so that said optical fiber is fixed to said light-receiving photo-semiconductor device by fixing said auxiliary mounting plate to said back face with said optical fiber as inserted and fixed in said through-hole.

13. The photo-semiconductor module according to claim 12, comprising an encapsulating resin which encapsulates surroundings of a connection between said input/output terminal electrode and said connection electrode, so that said encapsulating resin is used to fix said auxiliary mounting plate to said back face.

14. The photo-semiconductor module according to claim 1, wherein said light-receiving photo-semiconductor device is provided on a compound semiconductor substrate having a Pin-photodiode.

15. The photo-semiconductor module according to claim 14, wherein said circuit board has a connection electrode, so that said connection electrode to be connected at least to either one of P-side and N-side electrodes of said Pin-photodiode is provided at such a site of said circuit board that is opposite to a periphery of said light-receiving photo-semiconductor device.

* * * * *

UNITED STATES PATENT AND TRADEMARK OFFICE
CERTIFICATE OF CORRECTION

PATENT NO. : 6,803,639 B2
DATED : October 12, 2004
INVENTOR(S) : Masahiro Ono et al.

It is certified that error appears in the above-identified patent and that said Letters Patent is hereby corrected as shown below:

Column 15,
Line 3, change "though-hole" to -- through-hole --.

Signed and Sealed this

Twenty-fourth Day of May, 2005

JON W. DUDAS
*Director of the United States Patent and Trademark Office*